United States Patent
Kim et al.

(10) Patent No.: US 9,959,918 B2
(45) Date of Patent: May 1, 2018

(54) MEMORY DEVICE AND SYSTEM SUPPORTING COMMAND BUS TRAINING, AND OPERATING METHOD THEREOF

(71) Applicant: Samsung Electronics Co., Ltd., Suwon-si (KR)

(72) Inventors: Hye-Ran Kim, Hwaseong-si (KR); Tae-Young Oh, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/298,491

(22) Filed: Oct. 20, 2016

(65) Prior Publication Data

US 2017/0110165 A1 Apr. 20, 2017

Related U.S. Application Data

(63) Continuation-in-part of application No. 15/187,967, filed on Jun. 21, 2016, now Pat. No. 9,754,650.

(30) Foreign Application Priority Data

Oct. 20, 2015 (KR) .................. 10-2015-0146097
Sep. 20, 2016 (KR) .................. 10-2016-0120138

(51) Int. Cl.
  *G11C 8/10* (2006.01)
  *G11C 7/10* (2006.01)
  *G11C 8/18* (2006.01)
  *G11C 7/22* (2006.01)
  *G11C 29/02* (2006.01)

(52) U.S. Cl.
  CPC .............. *G11C 8/10* (2013.01); *G11C 7/1072* (2013.01); *G11C 7/222* (2013.01); *G11C 8/18* (2013.01); *G11C 29/023* (2013.01); *G11C 29/028* (2013.01); *G11C 2207/2254* (2013.01)

(58) Field of Classification Search
  CPC ........... G11C 8/10; G11C 8/18; G11C 7/1072; G11C 7/222; G11C 2207/2254
  See application file for complete search history.

(56) References Cited

U.S. PATENT DOCUMENTS

| | | |
|---|---|---|
| 5,083,296 A | 1/1992 | Hara et al. |
| 5,339,395 A | 8/1994 | Pickett et al. |
| 5,404,338 A | 4/1995 | Murai et al. |
| 5,602,798 A | 2/1997 | Sato et al. |
| 5,936,912 A | 8/1999 | Kawabata et al. |

(Continued)

OTHER PUBLICATIONS

Song et al. / A 1.1V 2Y-NM 4.35 GB/S/PIN 8 GB LPDDR4 Mobile Device With Bandwidth Improvement Technoques / 2014 / 4 Pages.

*Primary Examiner* — Vu Le
*Assistant Examiner* — Sung Cho
(74) *Attorney, Agent, or Firm* — Muir Patent Law, PLLC

(57) ABSTRACT

An operating method of a memory device includes entering into a command bus training mode, generating a plurality of internal clock signals by dividing a received clock signal, generating a plurality of internal chip selection signals by latching a received chip selection signal according to the plurality of internal clock signals, generating a second command/address signal by encoding a received first command/address signal based on the plurality of internal chip selection signals, and outputting the second command/address signal.

20 Claims, 28 Drawing Sheets

(56) References Cited

U.S. PATENT DOCUMENTS

| | | |
|---|---|---|
| 6,147,927 A | 11/2000 | Ooishi |
| 6,169,702 B1 | 1/2001 | Hoang et al. |
| 6,181,174 B1 | 1/2001 | Fujieda et al. |
| 6,188,641 B1 | 2/2001 | Uchida |
| 6,198,689 B1 | 3/2001 | Yamazaki et al. |
| 6,230,280 B1 | 5/2001 | Okasaka |
| 6,337,589 B1 | 1/2002 | Ooishi |
| 6,351,433 B1 | 2/2002 | Kosugi |
| 6,389,522 B1 | 5/2002 | Usami |
| 6,480,946 B1 | 11/2002 | Tomishima et al. |
| 6,845,460 B2 | 1/2005 | Lee et al. |
| 6,973,001 B1 | 12/2005 | Tomita |
| 7,818,527 B2 | 10/2010 | Kang |
| 7,889,595 B2 | 2/2011 | Park |
| 7,969,799 B2 | 6/2011 | Butt et al. |
| 8,055,930 B2 | 11/2011 | Bae et al. |
| 8,125,251 B2 | 2/2012 | Park |
| 8,139,430 B2 | 3/2012 | Buchmann et al. |
| 8,242,819 B2 | 8/2012 | Bae et al. |
| 8,458,507 B2 | 6/2013 | Salmon et al. |
| 8,879,342 B2 | 11/2014 | Jeon |
| 2004/0193777 A1 | 9/2004 | LaBerge |
| 2005/0141333 A1 | 6/2005 | Fujisawa |
| 2007/0260841 A1 | 11/2007 | Hampel et al. |
| 2008/0013663 A1 | 1/2008 | Cornelius et al. |
| 2009/0016120 A1 | 1/2009 | Kinoshita et al. |
| 2010/0177583 A1 | 7/2010 | Koshizuka |
| 2012/0117338 A1 | 5/2012 | Vaidyanath et al. |
| 2012/0185663 A1 | 7/2012 | Yokoya et al. |
| 2012/0250433 A1 | 10/2012 | Jeon |
| 2012/0260137 A1* | 10/2012 | Berke ............... G06F 13/1673 714/721 |
| 2012/0327728 A1 | 12/2012 | Anderson et al. |
| 2013/0097445 A1 | 4/2013 | Palaniappan et al. |
| 2013/0182524 A1 | 7/2013 | Jeon et al. |
| 2013/0201770 A1* | 8/2013 | Harris ................ G11C 5/025 365/189.011 |
| 2014/0181390 A1 | 6/2014 | Bains et al. |
| 2014/0241082 A1 | 8/2014 | Tam |
| 2014/0254295 A1* | 9/2014 | Shim .................. G11C 7/1072 365/194 |
| 2014/0289574 A1 | 9/2014 | Tsern et al. |
| 2015/0380069 A1 | 12/2015 | Matsui |
| 2016/0372171 A1* | 12/2016 | Ko ........................ G11C 7/22 |

* cited by examiner

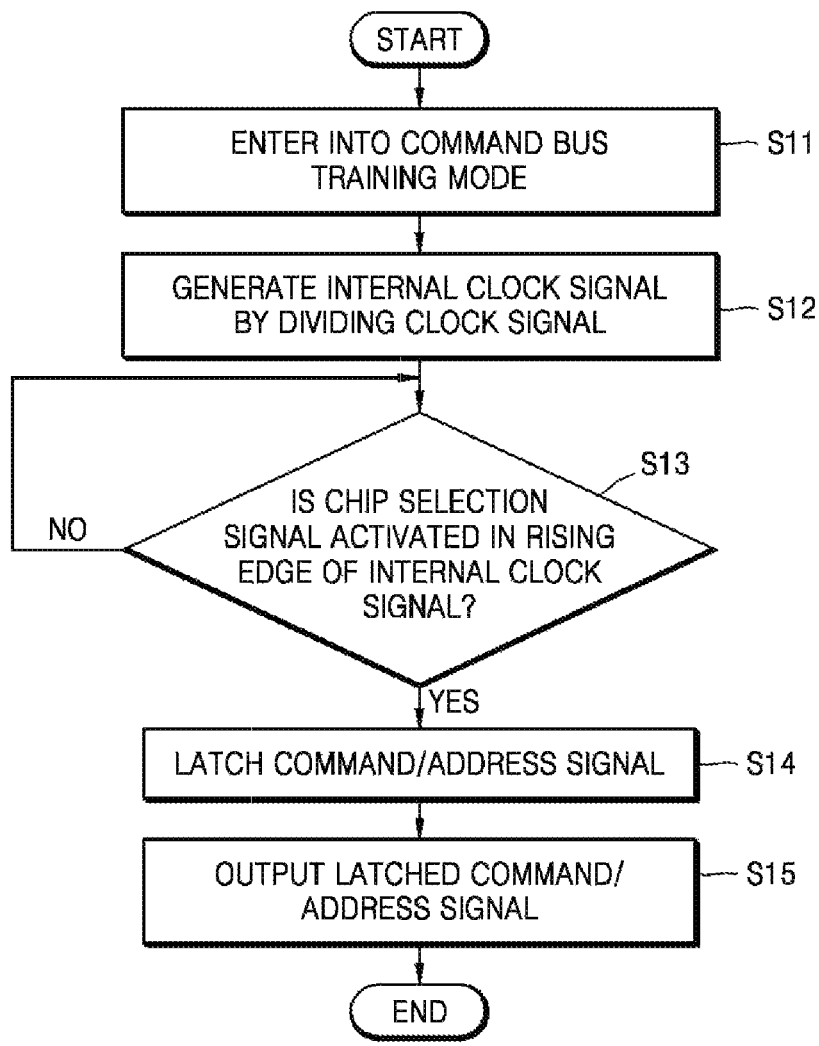

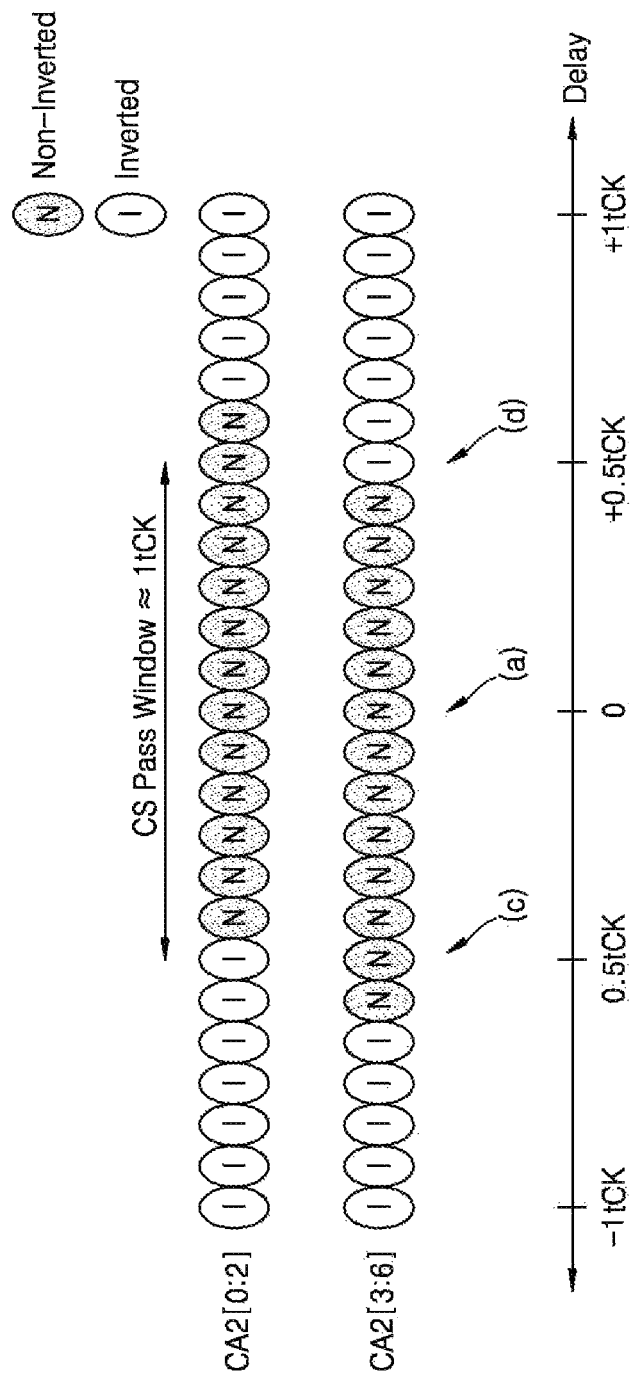

MEMORY DEVICE AND SYSTEM SUPPORTING COMMAND BUS TRAINING, AND OPERATING METHOD THEREOF

CROSS-REFERENCE TO RELATED APPLICATION

This application is a continuation-in-part of and claims priority to U.S. patent application Ser. No. 15/187,967, filed on Jun. 21, 2016, which claims priority to Korean Patent Application No. 10-2015-0146097, filed on Oct. 20, 2015, in the Korean Intellectual Property Office, the disclosure of each of which is incorporated herein in its entirety by reference. This application also claims priority under 35 USC § 119 to Korean Patent Application No. 10-2016-0120138, filed on Sep. 20, 2016, in the Korean Intellectual Property Office, the disclosure of which is incorporated herein in its entirety by reference.

BACKGROUND

The present disclosure relates to command bus training, and more particularly, to a memory device and system supporting command bus training, and an operating method thereof.

To support a high speed interface with a memory device, a memory controller may provide a clock signal to the memory device. The memory device may process signals received from the memory controller in response to the clock signal received from the memory controller, and may synchronize signals to be transmitted to the memory controller with the clock signal. Due to demands for a high data transmission speed, a frequency of a clock signal provided from the memory controller may increase. Also, it has become important to accurately capture signals transferred between the memory controller and the memory device. Thus, the memory device and the memory controller may typically implement a bus training method.

SUMMARY

The present disclosure provides a memory device and system supporting command bus training having improved accuracy, and an operating method thereof.

According to an aspect of the inventive concept, there is provided an operating method of a memory device supporting command bus training, the operating method including entering into a mode of the command bus training, receiving a clock signal, chip selection signal and a first command/address signal, generating a plurality of internal clock signals by dividing the clock signal, generating a plurality of internal chip selection signals by latching the chip selection signal according to the plurality of internal clock signals, generating a second command/address signal by encoding the first command/address signal based on the plurality of internal chip selection signals, and outputting the second command/address signal.

According to another aspect of the inventive concept, there is provided a command bus training method in a system in which a command/address signal and a clock signal are provided to a memory device from a memory controller, the command bus training method including generating a plurality of internal clock signals in the memory device by dividing the clock signal, transmitting a first command/address signal by the memory controller, transmitting a chip selection signal by the memory controller, the chip selection signal having an adjustable delay with respect to the internal clock signal, generating a plurality of internal chip selection signals in the memory device by latching the chip selection signal according to the plurality of internal clock signals, generating and transmitting by the memory device, a second command/address signal by encoding the first command/address signal based on the plurality of internal chip selection signals, and determining a delay of the chip selection signal based on the first and second command/address signals in the memory controller.

BRIEF DESCRIPTION OF THE DRAWINGS

Embodiments of the present disclosure will be more clearly understood from the following detailed description taken in conjunction with the accompanying drawings in which:

FIG. 7 is a flowchart of an operating method of the memory device of FIG. 4, according to exemplary embodiments;

FIGS. 17A and 17B are diagrams for describing an operation of determining a timing of a chip selection signal via a memory controller;

DETAILED DESCRIPTION OF THE EMBODIMENTS

Figure 1:
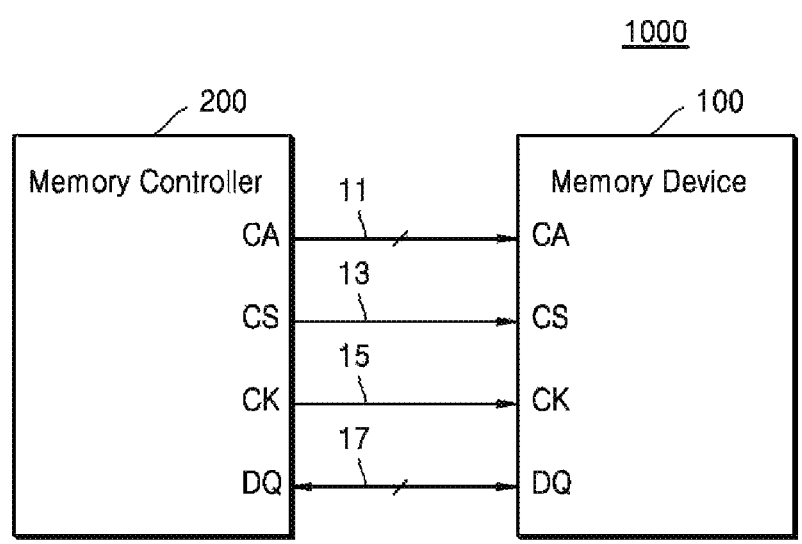
FIG. 1 is a block diagram of a system including a memory device and a memory controller according to example embodiments.

FIG. 1 is a block diagram of a system 1000 including a memory device 100 and a memory controller 200 according to example embodiments. As illustrated in FIG. 1, the system 1000 may include the memory device 100 and the memory controller 200, and may be referred to as a memory system.

As used herein, a semiconductor device may refer to various items such as a memory device, one or more logic devices or memory cells formed in or on a semiconductor substrate, a semiconductor chip, a memory chip, a memory die, a logic chip, a package, a package including one or more memory chips and optionally one or more logic chips, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages.

An electronic device, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

The memory device 100 may include a memory cell array including a plurality of memory cells. According to example embodiments, the memory cells may be volatile memory cells, and the memory device 100 may include, but is not limited to, dynamic random access memory (DRAM), static random access memory (SRAM), mobile DRAM, double data rate synchronous dynamic random access memory (DDR SDRAM), low power DDR (LPDDR) SDRM, graphic DDR (GDDR) SDRAM, rambus dynamic random access memory (RDRAM), etc. According to example embodiments, the memory cells may be non-volatile memory cells, and the memory device 100 may include, but is not limited to, electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), etc. Hereinafter, it is described that the memory device 100 is DRAM. However, the present disclosure is not limited thereto.

The memory controller 200 may receive a request of access to the memory device 100 from a host (not shown), and may communicate with the memory device 100 in response to the received request. Although the memory controller 200 is illustrated as a separate component in FIG. 1, the memory controller 200 may be included in other separate components, such as a processor, etc. according to exemplary embodiments.

Referring to FIG. 1, in order to reduce the number of signal lines between the memory device 100 and the memory controller 200, a command and an address may be transmitted as a command/address signal CA to the memory device 100 from the memory controller 200 through a command/address bus 11. A chip selection signal CS may be transmitted to the memory device 100 from the memory controller 200 through a chip selection line 13. An activated chip selection signal CS may indicate that the command/address signal CA transmitted through the command/address bus 11 is a command, and a deactivated chip selection signal CS may indicate that the command/address signal CA transmitted through the command/address bus 11 is an address. A data signal (or data) DQ may be transmitted to the memory device 100 from the memory controller 200 or may be transmitted to the memory controller 200 from the memory device 100, through a data bus 17 including bi-directional signal lines.

When a data storage capacity of the memory device 100 increases, and devices accessing the memory device 100, such as a central processing unit (CPU), a graphics processing unit (GPU), an intellectual property (IP) core, etc., have increased operating speeds, the memory device 100 may support a high-speed interface. For example, as illustrated in FIG. 1, the memory device 100 may receive a clock signal CK from the memory controller 200 through a clock line 15, and based on the received clock signal CK, may capture signals received from the memory controller 200, such as the command/address signal CA, the chip selection signal CS, the data signal DQ, etc. Also, the memory device 100 may transmit the data signal DQ synchronized with the received clock signal CK to the memory controller 200 so that the memory controller 200 can capture the data signal DQ. FIG. 1 illustrates an example in which the clock signal CK is transmitted through one clock line 15. However, the clock signal CK may be differentially transmitted through two signal lines. Hereinafter, it is described that the memory device 100 operates in synchronization with a rising edge of the clock signal CK. However, the memory device 100 may operate in synchronization with a falling edge of the clock signal CK, according to exemplary embodiments.

In order to capture the command/address signal CA, the chip selection signal CS, and the data signal DQ based on the clock signal CK having a high frequency, the memory device 100 and the memory controller 200 may support a bus training mode. That is, the memory controller 200 may perform bus training with respect to the command/address bus 11, the chip selection line CS, and/or the data bus 17, when a power supply voltage is supplied to the system 1000 or a specific condition is met. For example, the memory controller 200 may transmit a command entering into the bus training mode to the memory device 100 through the command/address bus 11 together with the clock signal CK having low frequency, and the memory device 100 may enter into the bus training mode. In the bus training mode, the memory controller 200 may transmit a specific signal to the memory device 100 through a signal line which is subject to training, together with the clock signal CK having high frequency, and may receive a response from the memory device 100. The memory controller 200 may determine a timing (e.g. a delay) of the signal transmitted through the training subject signal line, based on the response received from the memory device 100.

Data bus training may be performed by determining whether the data signal DQ transmitted through the data bus 17 at a rising edge of the clock signal CK is accurately captured by the memory device 100, after a certain period of time has passed after the memory controller 200 transmits a specific command through the command/address bus 11. Meanwhile, command bus training may be performed before the data bus training is performed, and may be performed by determining whether the command/address signal CA transmitted through the command/address bus 11 at a rising edge of the clock signal CK is accurately captured by the memory device 100. Also, the chip selection signal CS indicating that the command/address signal CA is a command may have an active pulse width that is equal to or less than a general cycle of the clock signal CK, and thus, the command bus training may include training an activated chip selection signal CS.

As described above, the data bus training may check whether the data signal DQ is accurately captured in a specific rising edge of the clock signal CK, while the command bus training may be performed before the data bus training and may check whether the command/address signal CA and the chip selection signal CS are accurately captured in an unspecified rising edge of the clock signal CK. Accordingly, the command bus training may be more difficult than the data bus training. Detailed aspects with respect to the command bus training will be described as follows with reference to FIG. 2.

Figure 2:
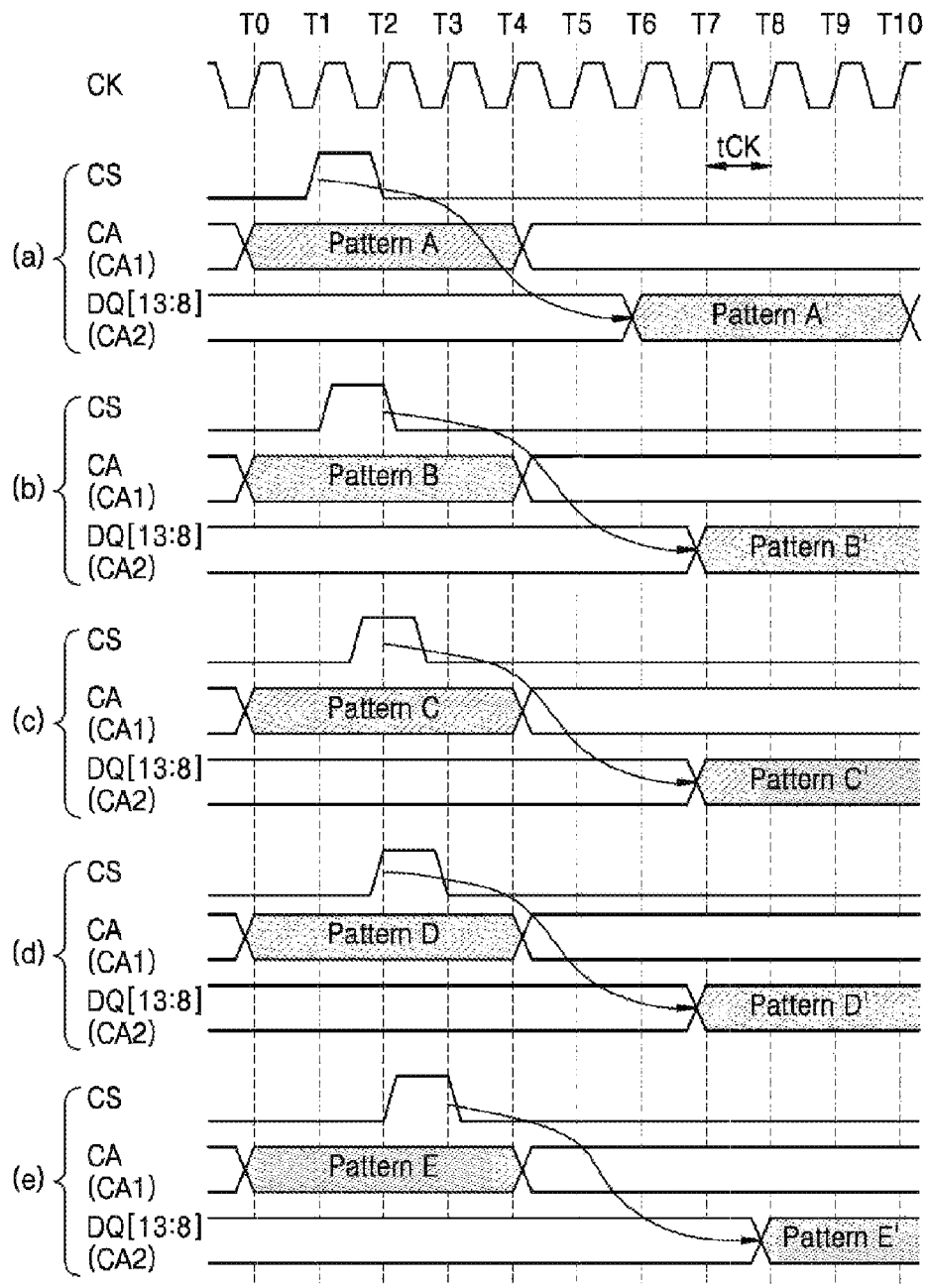
FIG. 2 is an exemplary timing diagram of signals transferred between a memory device and a memory controller during command bus training.
Figure 3:
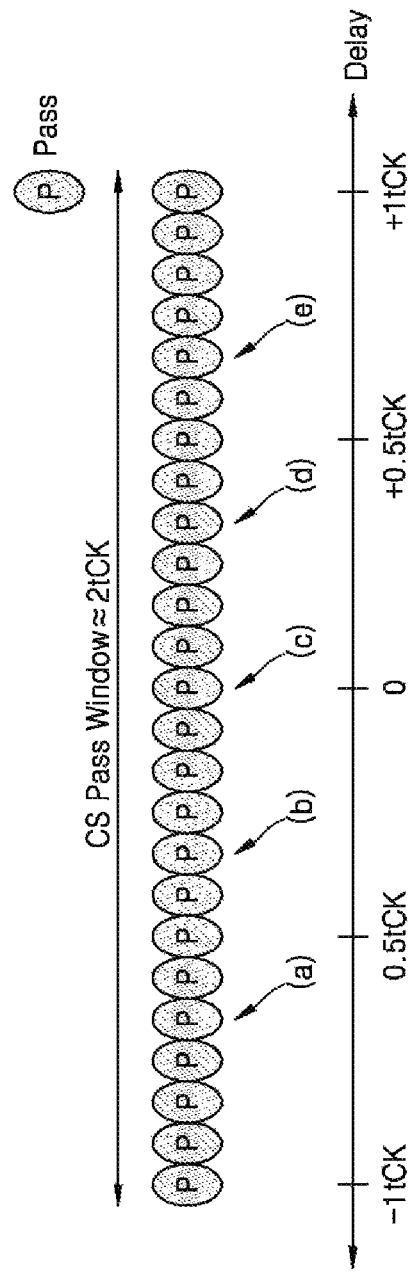
FIG. 3 is a diagram for describing an operation of determining a timing of a chip selection signal by a memory controller.

FIG. 2 is an exemplary timing diagram of signals transferred between the memory device 100 and the memory controller 200 during command bus training. FIG. 3 is a diagram for describing an operation of determining a timing of the chip selection signal CS by the memory controller 200. Hereinafter, FIGS. 2 and 3 will be described with reference to FIG. 1.

During the command bus training, the memory controller 200 may repeat an operation of transmitting the chip selection signal CS to the memory device 100 and receiving a response from the memory device 100. That is, the memory controller 200 may adjust a delay of an active pulse (e.g., high pulse) of the chip selection signal CS with respect to the clock signal CK (e.g., a rising edge or a falling edge of the clock signal CK) and determine a timing of the chip selection signal CS based on responses of the memory device 100 corresponding to a plurality of delays of the chip selection signal CS. The active pulse width of the chip selection signal CS may be equal to or less than a cycle tCK of the clock signal CK.

FIG. 2 illustrates the exemplary timing diagram of the signals transferred between the memory device 100 and the memory controller 200 in five different delays of the chip selection signal CS, based on a transmission and reception time in the memory device 100. Each of the signals may be transferred between the memory device 100 and the memory controller 200 through a different signal line, and thus, may have a different delay. Thus, even if the memory controller 200 transmits the chip selection signal CS such that a rising edge of the clock signal CK is in a middle of the active pulse of the chip selection signal CS, the rising edge of the clock signal CK may be at other points than the middle of the active pulse of the chip selections signal CS, in the memory device 100.

Referring to (a) of FIG. 2, the memory controller 200 may transmit a first command/address signal CA1 having Pattern A through the command/address bus 11, and may transmit a chip selection signal CS having a rising edge near T1. Referring to (b) of FIG. 2, the memory controller 200 may transmit the first command/address signal CA1 having Pattern B through the command/address bus 11, and may transmit the chip selection signal CS having a falling edge near T2. Referring to (c) of FIG. 2, the memory controller 200 may transmit the first command/address signal CA1 having Pattern C through the command/address bus 11, and may transmit the chip selection signal CS, a middle of an active pulse of which is located near T2. Referring to (d) of FIG. 2, the memory controller 200 may transmit the first command/address signal CA1 having Pattern D through the command/address bus 11, and may transmit the chip selection signal CS having a rising edge near T2. Referring to (e) of FIG. 2, the memory controller 200 may transmit the first command/address signal CA1 having Pattern E through the command/address bus 11, and may transmit the chip selection signal CS having a falling edge near T3. As illustrated in FIG. 2, the first command/address signal CA1 transmitted by the memory controller 200 may maintain each of the patterns for a sufficiently long time period. Also, it is desirable that the timing of the chip selection signal CS illustrated in (c) of FIG. 2 be determined as an optimal timing of the chip selection signal CS.

The memory controller 200 may transmit the first command/address signal CA1 to the memory device 100 through the command/address bus 11 together with the chip selection signal CS of which the timing is adjusted. When the chip selection signal CS is activated at a rising edge of the clock signal CK, the memory device 100 may generate a second command/address signal CA2 by latching the first command/address signal CA1. The memory device 100 may transmit the second command/address signal CA2 to the memory controller 200, and the memory controller 200 may compare the first command/address signal CA1 and the second command/address signal CA2. For example, the command/address bus 11 may include six signal lines, and the memory device 100 may transmit the second command/address signal CA2 to the memory controller 200 through the six signal lines (for example, DQ[13:8] of DQ[15:0] illustrated in FIG. 2) of the data bus 17.

In the five cases illustrated in FIG. 2, the memory device 100 may transmit the second command/address signal CA2 generated by latching the first command/address signal CA1 at the rising edge of the clock signal CK to the memory controller 200 through some signal lines of the data bus 17. As illustrated in FIG. 2, in the five cases, the second command/address signal CA2 may have Pattern A', Pattern B', Pattern C', Pattern D', and Pattern E', respectively. As illustrated in FIG. 2, the second command/address signal CA2 transmitted from the memory device 100 may maintain each of the patterns for a sufficiently long time period.

When the first command/address signal CA1 and the second command/address signal CA2 correspond to each other, the memory controller 200 may determine the timing in which the chip selection signal CS is transmitted as pass. When the first command/address signal CA1 and the second command/address signal CA2 do not correspond to each other, the memory controller 200 may determine the timing in which the chip selection signal CS is transmitted as fail. The memory controller 200 may determine an optimal timing of the chip selection signal CS based on a plurality of comparison results.

FIG. 3 illustrates a plurality of comparison results corresponding to a plurality of different delays of the chip selection signal CS, when a delay of the chip selection signal CS illustrated in (c) of FIG. 2 is assumed to be 0. For example, in (a) of FIG. 2, an active pulse of the chip selection signal CS may be sampled at a rising edge of the clock signal CK at T1, and the memory device 100 may transmit the second command/address signal CA2 having Pattern A' to the memory controller 200 by latching the first command/address signal CA1 having Pattern A. Since the active pulse of the chip selection signal CS is sampled at T1, the memory device 100 may transmit the second command/address signal CA2 having Pattern A' identical to Pattern A of the first command address signal CA1 to the memory controller 200, and as illustrated in (a) of FIG. 3, the memory controller 200 may determine the timing of the chip selection signal CS illustrated in (a) of FIG. 2 as pass.

Active pulses of the chip selection signal CS illustrated in (b) through (d) of FIG. 2 may be sampled at a rising edge of the clock signal CK at T2. Accordingly, Pattern B, Pattern C, and Pattern D of the first command/address signal CA1 may respectively be identical to Pattern B', Pattern C', and Pattern D' of the second command/address signal CA2. As illustrated in (b) through (d) of FIG. 3, the memory controller 200 may determine all of the timings of the chip selection signal CS illustrated in (b) through (d) of FIG. 2 as pass.

An active pulse of the chip selection signal CS illustrated in (e) of FIG. 2 may be sampled at a rising edge of the clock signal CK at T3. Accordingly, Pattern D of the first command/address signal CA1 may be identical to Pattern D' of the second command/address signal CA2. As illustrated in (e) of FIG. 3, the memory controller 200 may determine the timing of the chip selection signal CS illustrated in (e) of FIG. 2 as pass.

As illustrated in FIG. 3, with respect to the chip selection signal CS having an active pulse width that is equal to or less than 1 tCK, a pass window (e.g., CS pass window) that is equal to 2 tCK or greater than 1 tCK may be measured. That is, even if at least one of the active pulses of the chip selection signal CS illustrated in (a) and (e) of FIG. 2 have to be determined as fail, all of the active pulses of the chip selection signal CS illustrated in (a) and (e) of FIG. 2 may be determined as pass, due to the rising edges of the clock signal CK at T1 and T3, which are adjacent to T2. Accordingly, the memory controller 200 may not determine an optimal timing (e.g., (c) of FIG. 2) of the active pulse of the chip selection signal CS illustrated in (c) of FIG. 2.

As described hereinafter, a memory device according to example embodiments may generate an internal clock signal by dividing a received clock signal CK, and may sample a chip selection signal CS by using the internal clock signal, in order to improve the accuracy of the command bus training. A memory controller may change the internal clock signal (e.g. a phase of the internal clock signal) generated by the memory device, and may perform command bus training according to the changed internal clock signal. Also, training with respect to the command/address bus 11 may be omitted due to the chip selection line 13, which is accurately trained, and thus, the time consumed by the command bus training may be reduced.

Figure 4:
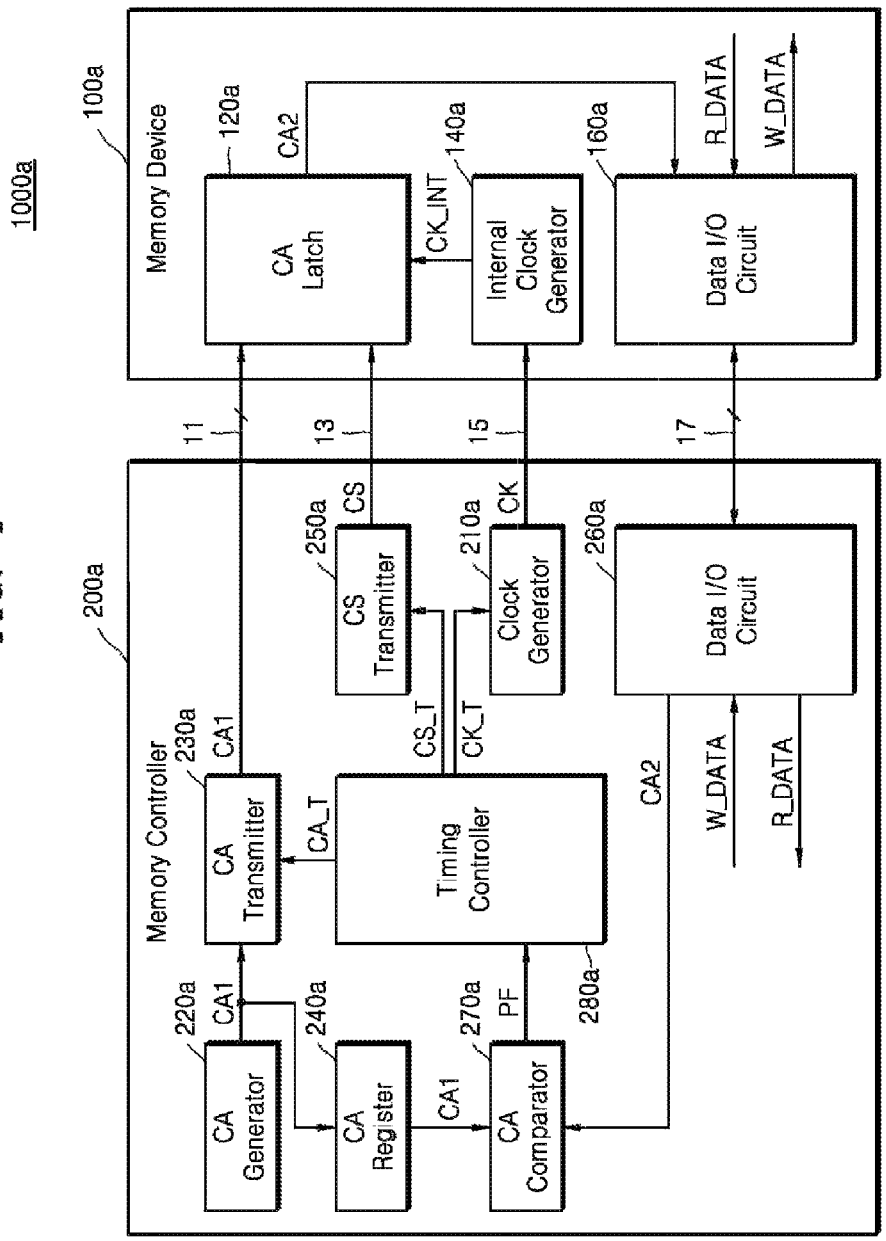
FIG. 4 is a block diagram of a system including a memory device and a memory controller according to exemplary embodiments.

FIG. 4 is a block diagram of a system 1000a including a memory device 100a and a memory controller 200a according to example embodiments. As illustrated in FIG. 4, the memory device 100a and the memory controller 200a may communicate with each other through the command/address bus 11, the chip selection line 13, the clock line 15, and the data bus 17.

Referring to FIG. 4, the memory device 100a may include a command/address latch 120a, an internal clock generator 140a, and a data input/output circuit 160a. Components included in the memory device 100a are separately illustrated in FIG. 4, for convenience of explanation. For example, at least two of the components may be realized as one component.

The internal clock generator 140a may receive a clock signal CK from the memory controller 200a through the clock line 15, and may generate an internal clock signal CK_INT by dividing the clock signal CK. For example, a frequency of the internal clock signal CK_INT may be, for example, ½ or ¼ of a frequency of the clock signal CK. For example, a frequency of the clock signal CK may be 1 GHz and a frequency of the internal clock signal CK_INT may be 500 MHz or 250 MHz.

In example embodiments, the internal clock generator 140a may receive a clock signal CK from the memory controller 200a through the clock line 15, and may generate a plurality of internal clock signals CK_INT by dividing the clock signal CK. For example, each of the plurality of internal clock signals CK_INT may have the same frequency (e.g., 1 GHz) by dividing the clock signal CK (e.g., 2 GHz, 4 GHz, etc.), and may have a different phase with respect to each other (e.g., 90°, 180°, 270°, etc.).

In example embodiments, the memory controller 200a may generate and transmit a first clock signal CK1 and a second clock signal CK2 having ½ or ¼ frequency of the first clock signal CK1 through the clock line 15. In that case, the clock line 15 may include a plurality of clock lines.

The command/address latch 120a may receive a first command/address signal CA1 from the memory controller 200a through the command/address bus 11, and may receive a chip selection signal CS from the memory controller 200a through the chip selection line 13. Also, the command/address latch 120a may receive the internal clock signal CK_INT from the internal clock generator 140a, and may output a second command/address signal CA2 by latching the first command/address signal CA1 when the chip selection signal CS is activated at a rising edge of the internal clock signal CK_INT.

The data input/output circuit 160a may receive write data W_DATA from the memory controller 200a through the data bus 17, and may output the write data W_DATA (e.g., to a memory cell array). Also, the data input/output circuit 160a may receive read data R_DATA (e.g., from the memory cell array) and may transmit the read data R_DATA to the memory controller 200a through the data bus 17. During a command bus training mode, the data input/output circuit 160a may transmit the second command/address signal CA2 received from the command/address latch 120a to the memory controller 200a through some signal lines of the data bus 17.

Although it is not illustrated in FIG. 4, the memory device 100a may include a control logic unit (not shown) (as used herein, a "unit" may refer to a "circuit"), and during the command bus training mode, the control logic unit may enable the command/address latch 120a, the internal clock generator 140a, and the data input/output circuit 160a or control the command/address latch 120a, the internal clock generator 140a, and the data input/output circuit 160a to perform specific operations.

As illustrated in FIG. 4, since the internal clock signal CK_INT generated by dividing the clock signal CK transmitted to the memory device 100a from the memory controller 200a is used to sample the chip selection signal CS, problems illustrated in FIGS. 2 and 3 may be solved. Detailed aspects with respect to the operation of the memory device 100a will be described later with reference to FIGS. 5 and 6.

Referring to FIG. 4, the memory controller 200a may include a clock generator 210a, a command/address generator 220a, a command/address transmitter 230a, a command/address register 240a, a chip selection transmitter 250a, a data input/output circuit 260a, a command/address comparator 270a, and a timing controller 280a. Components included in the memory controller 200a are separately illustrated in FIG. 4, for convenience of explanation. For example, at least two of the components may be realized as one component.

The clock generator 210a may receive a clock control signal CK_T from the timing controller 280a. The clock generator 210a may adjust a timing, for example, a frequency, of the clock signal CK transmitted through the clock line 15 in response to the clock control signal CK_T.

The command/address generator 220a may generate the first command/address signal CA1. For example, the command/address generator 220a may generate the first command/address signal CA1 having a specific pattern. The command/address transmitter 230a may receive the first command/address signal CA1 from the command/address generator 220a, and may receive a command/address control signal CA_T from the timing controller 280a. The command/address transmitter 230a may adjust a timing of the first command/address signal CA1 transmitted through the command/address bus 11 in response to the command/address control signal CA_T.

The command/address register 240a may receive and store the first command/address signal CA1 generated by the command/address generator 220a. FIG. 4 illustrates the example in which the command/address register 240a receives the first command/address signal CA1 from the command/address generator 220a. In example embodiments, the command/address register 240a may receive and store the first command/address signal CA1 output by the command/address transmitter 230a.

The chip selection transmitter 250a may receive a chip selection control signal CS_T from the timing controller 280a, and may adjust a timing of the chip selection signal CS transmitted through the chip selection line 13, for example, a delay of an active pulse (e.g., pulse remaining a high level) of the chip selection signal CS, in response to the chip selection control signal CS_T.

The data input/output circuit 260a may receive read data R_DATA from the memory device 100a (e.g., a memory cell array) through the data bus 17, and may output the read data R_DATA. Also, the data input/output circuit 260a may receive write data W_DATA, and may transmit the write data W_DATA to the memory device 100a through the data bus 17. During the command bus training mode, the data input/output circuit 260a may transmit the second command/address signal CA2 received from the memory device 100a to the command/address comparator 270a through some signal lines of the data bus 17.

The command/address comparator 270a may compare the first command/address signal CA1 stored in the command/address register 240a with the second command/address signal CA2 received from the memory device 100a through the data input/output circuit 260a. The command/address comparator 270a may output a pass/fail signal PF according to a result of comparing the first command/address signal CA1 with the second command/address signal CA2.

The timing controller 280a may control a timing of each of signals transmitted to the memory device 100a. As described above, the timing controller 280a may control the timing of the clock signal CK, the first command/address signal CA1, and the chip selection signal CS by outputting the clock control signal CK_T, the command/address control signal CA_T, and the chip selection control signal CS_T, respectively. Also, the timing controller 280a may receive the pass/fail signal PF from the command/address comparator 270a, may determine the timing of the chip selection signal CS based on the pass/fail signals PF corresponding to a plurality of different timings of the chip selection signal CS, and may determine a timing of the first command/address signal CA1 based on the pass/fail signals PF corresponding to a plurality of different timings of the first command/address signal CA1.

Figure 5:
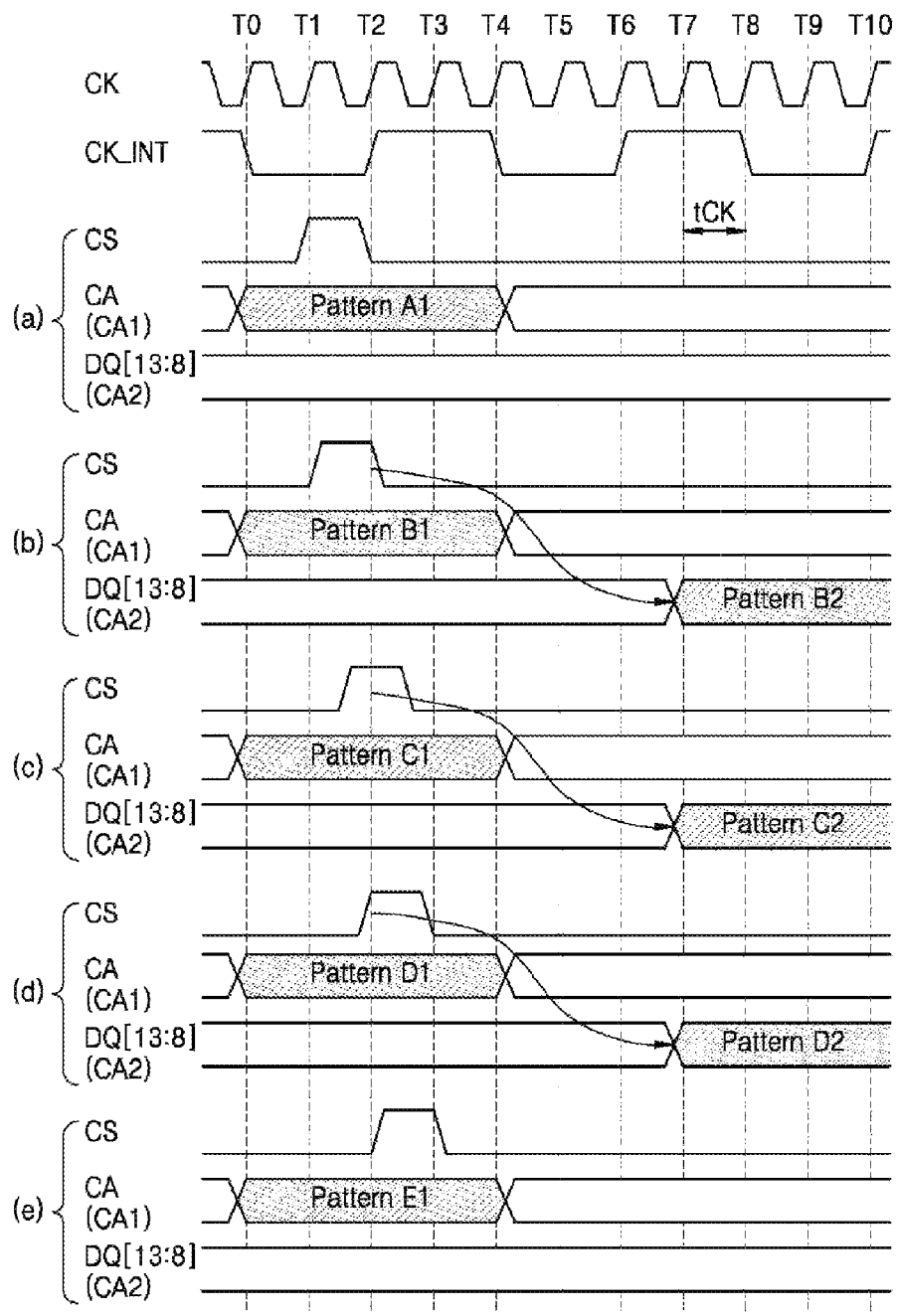
FIG. 5 is an exemplary timing diagram of signals transferred between the memory device and the memory controller of FIG. 4 during command bus training according to example embodiments.
Figure 6:
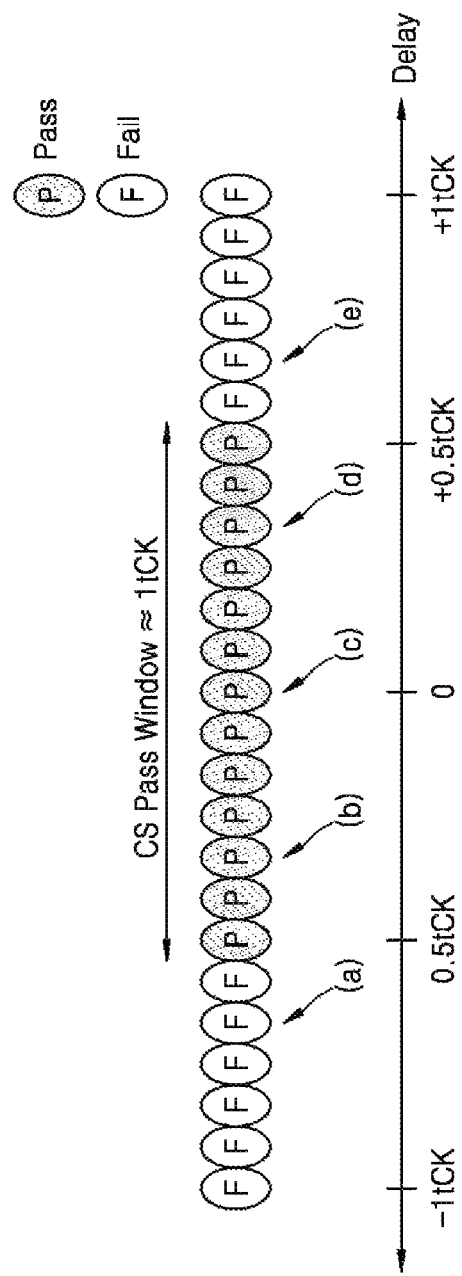
FIG. 6 is a diagram for describing an operation of determining a timing of a chip selection signal by a memory controller according to example embodiments.

FIG. 5 is an exemplary timing diagram of signals transferred between the memory device 100a and the memory controller 200a of FIG. 4, during a command bus training operation. FIG. 6 is a diagram for describing an operation of determining a timing of the chip selection signal CS by the memory controller 200a. Hereinafter, FIGS. 5 and 6 will be described with reference to FIG. 4.

Referring to FIG. 5, the internal clock generator 140a of the memory device 100a illustrated in FIGS. 5 and 6 may generate an internal clock signal CK_INT having a frequency that is ¼ of a frequency of the clock signal CK. Active pulses of the chip selection signal CS illustrated in (a) through (e) of FIG. 5 may have the same delays as the active pulses of the chip selection signal CS illustrated in (a) through (e) of FIG. 2, respectively. For example, the clock signal CK has 4 clock cycles (i.e., 4 tCK) during one clock cycle (i.e., 1 tCK) of the internal clock signal CK_INT. Thus, a frequency of the clock signal CK may be 4 times of a frequency of the internal clock signal CK_INT. As illustrated in FIG. 5, only the active pulses of the chip selection signal CS illustrated in (b) through (d) of FIG. 5 may be sampled due to a rising edge of the internal clock signal CK_INT at T2. Accordingly, patterns of the second command/address signal CA2 transmitted from the memory device 100a, for example, Pattern B2, Pattern C2, and Pattern D2 may be identical to Pattern B1, Pattern C1, and Pattern D1 of the first command/address signal CA1, respectively. On the contrary, the active pulses of the chip selection signal CS illustrated in (a) and (e) of FIG. 5 may not be sampled due to the rising edge of the internal clock signal CK_INT at T2. Accordingly, the memory device 100a may transmit the second command/address signal CA2 maintaining a previous pattern or having a default pattern, and the pattern of the second command/address signal CA2 may be different from the patterns of the first command/address signal CA1, that is, Pattern A1 and Pattern E1.

In example embodiments, each of the Patterns A1~E1 may include a command signal (e.g., active, precharge, refresh, read, write, etc.) or an address signal based on the chip selection signal CS. For example, the first command/address signal CA1 may include control signals (e.g., WE, RAS, CAS, etc.) or a plurality of address signals.

In example embodiments, instead of the chip selection signal CS illustrated in (a) through (e) of FIG. 5, each of the control signals and address signals of the first command/address signal CA1 having adjustable delays (or, variable delays) with respect to the internal clock signal CK_INT may be input. In this case, it is assumed that the chip selection signal CS has a sufficient margin that does not affect to the training mode operation when the first command/address signal CA1 latches.

As illustrated in FIG. 6, due to the internal clock signal CK_INT divided from the clock signal CK, a pass window (e.g., CS pass window) of about 1 tCK may be measured with respect to the chip selection signal CS having an active pulse width of about 1 tCK. Accordingly, the memory controller 200a (that is, the timing controller 280a of the memory controller 200a) may determine a timing of the active pulse of the chip selection signal CS corresponding to a median portion (c) of the pass window, as the timing of the chip selection signal CS. In example embodiments, when the first command/address signal CA1 having adjustable delays input, the memory controller 200a may determine a timing of the first command/address signal CA1 corresponding to a median portion (c) of a pass window (e.g., first command/address signal CA1 pass window), as the timing of the first command/address signal CA1.

FIG. 7 is a flowchart of an operating method of the memory device 100a of FIG. 4, according to example embodiments. As illustrated in FIG. 7, the operating method of the memory device 100a may include operations S11 through S15.

In operation S11, an operation of entering into a command bus training mode may be performed. For example, the memory controller 200a may transmit a command for entering into the command bus training mode to the memory device 100a, and the memory device 100a may enter into the command bus training mode in response to the received command.

In operation S12, an operation of generating the internal clock signal CK_INT by dividing the clock signal CK may be performed. For example, the internal clock generator 140a of the memory device 100a may generate the internal clock signal CK_INT having a frequency, for example, ½ or ¼ of a frequency of the clock signal CK by dividing the clock signal CK.

In operation S13, an operation of determining whether the chip selection signal CS is activated or not at the rising edge (or the falling edge) of the internal clock signal CK_INT may be performed. When the chip selection signal CS is activated at the rising edge of the internal clock signal CK_INT, an operation of latching a command/address signal may be performed in operation S14. For example, the command/address latch 120a of the memory device 100a may receive the chip selection signal CS, the first command/address signal CA1, and the internal clock signal CK_INT, and when the chip selection signal CS is activated at the rising edge of the internal clock signal CK_INT, the command/address latch 120a of the memory device 100a may latch the first command/address signal CA1 to generate the second command/address signal CA2.

In operation S15, an operation of outputting the latched command/address signal may be performed. For example, the data input/output circuit 160a of the memory device 100a may receive the second command/address signal CA2 from the command/address latch 120a, and may transmit the second command/address signal CA2 to the memory controller 200a through some signal lines of the data bus 17.

Figure 8A:
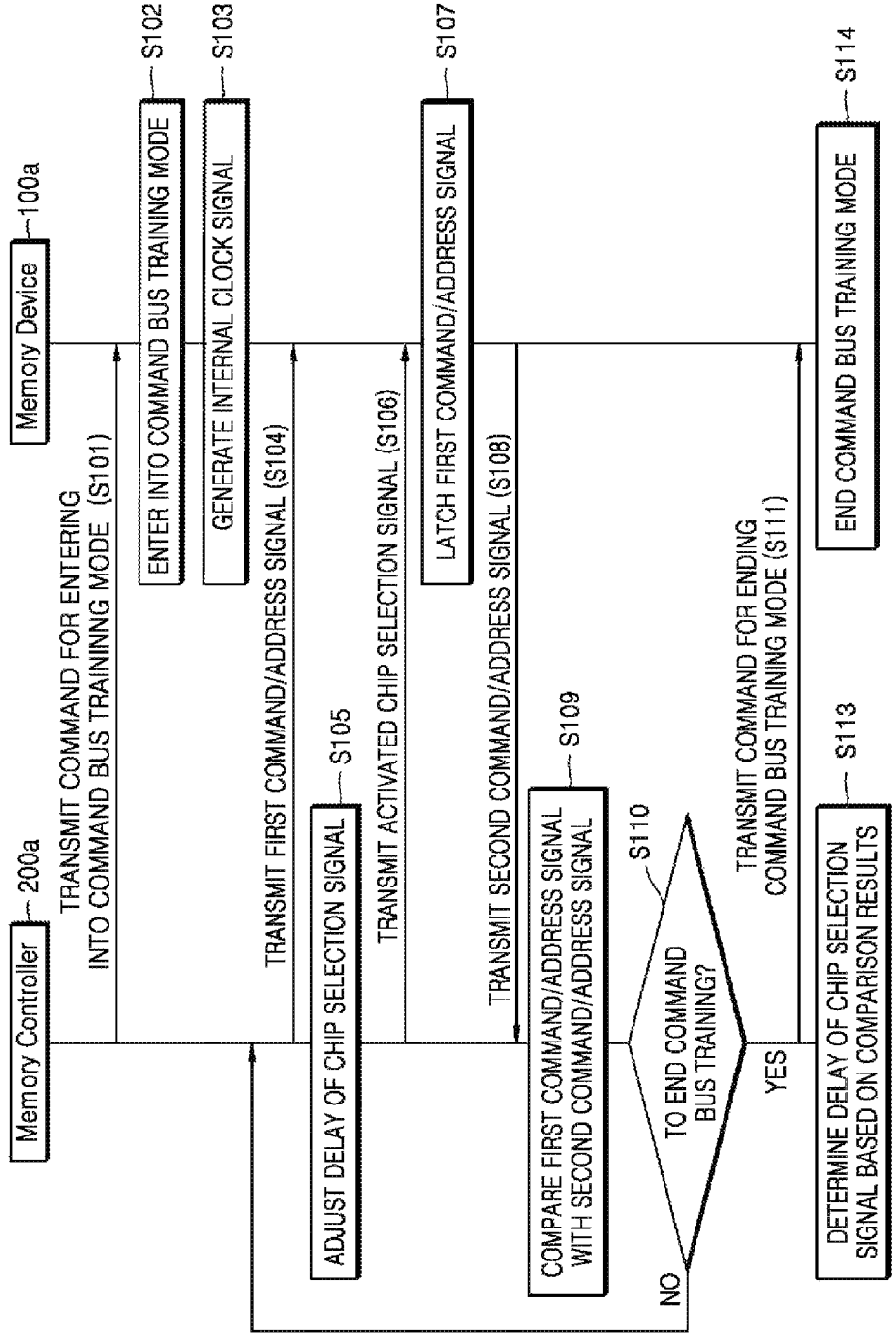
FIG. 8A is a diagram for describing an operation between the memory device and the memory controller of FIG. 4 according to the passage of time, according to exemplary embodiments.

FIG. 8A is a diagram for describing an operation between the memory device 100a and the memory controller 200a of FIG. 4 according to the passage of time, according to example embodiments.

The memory controller 200a may transmit the command for entering into the command bus training mode in operation S101. The memory device 100a may enter into the command bus training mode in response to the received command in operation S102. The memory device 100a may generate the internal clock signal CK_INT by dividing the clock signal CK received from the memory controller 200a, in operation S103.

The memory controller 200a may transmit the first command/address signal CA1 in operation S104. For example, the memory controller 200a may transmit the first command/address signal CA1 having a specific pattern (e.g., active, precharge, refresh, read, write, etc.). Then, the memory controller 200a may adjust a delay of the chip selection signal CS in operation S105. For example, the memory controller 200a may adjust a delay of an active pulse of the chip selection signal CS to gradually increase or decrease. The memory controller 200a may transmit the activated chip selection signal CS in operation S106. For example, the memory controller 200a may transmit the active pulse of the chip selection signal CS according to the adjusted delay.

When the activated chip selection signal CS is sampled at a rising edge (or, falling edge) of the internal clock signal CK_INT, the memory device 100a may latch the first command/address signal CA1 in operation S107. The memory device 100a may generate the second command/address signal CA2 by latching the first command/address signal CA1, and may transmit the second command/address signal CA2 to the memory controller 200a in operation S108.

The memory controller 200a may compare the first command/address signal CA1 with the second command/address signal CA2 in operation S109, and may accumulate results of the comparison. The memory controller 200a may determine whether to end the command bus training in operation S110. For example, the memory controller 200a may determine whether the delay of the chip selection signal CS is adjusted to a maximum value (or a minimum value) which is adjustable or variable. Alternatively, the memory controller 200a may determine whether the delay of the chip selection signal CS may be determined based on the accumulated results of the comparison. When the command bus training is not ended, the memory controller 200a may repeat to transmit the first command/address signal in operation S104. In addition, the first command/address signal CA1 may have a different pattern from the previous first command/address signal CA1. On the other hand, when the command bus training is ended, the memory controller 200a may transmit a command for ending the command bus training mode to the memory device 100a in operation S111. The memory device 100a may end the command bus training mode in response to the received command in operation S114.

The memory controller 200a may determine the delay of the chip selection signal CS based on the accumulated results of the comparison in operation S113. For example, as illustrated in FIG. 6, the memory controller 200a may select the delay of the chip selection signal CS corresponding to a median of the CS pass window (e.g., (c) of FIG. 6).

Figure 8B:
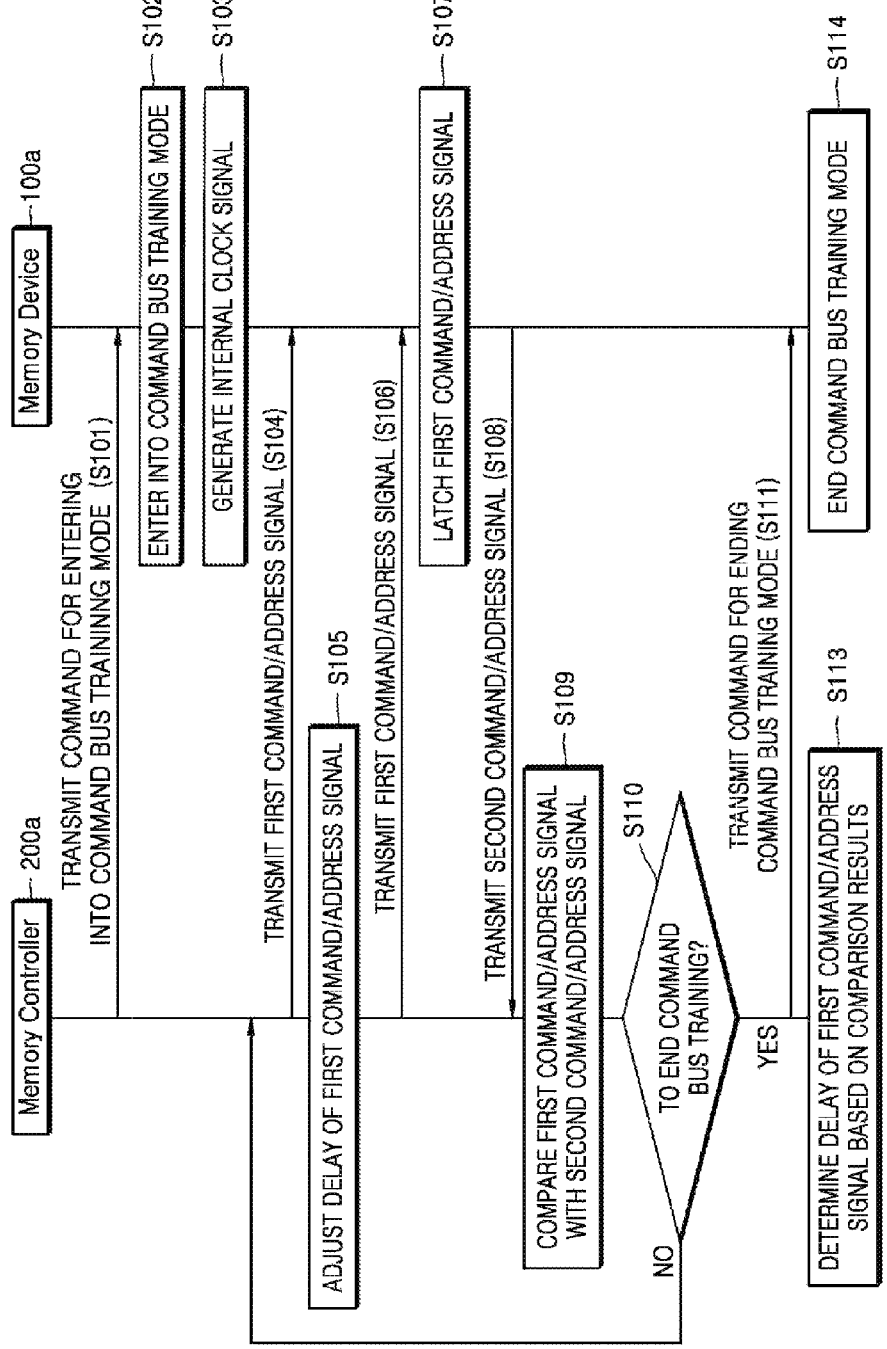
FIG. 8B is a diagram for describing an operation between the memory device 100a and the memory controller 200a of FIG. 4 according to example embodiments.

FIG. 8B is a diagram for describing an operation between the memory device 100a and the memory controller 200a of FIG. 4, according to example embodiments. Hereinafter, aspects that are the same or substantially the same as the aspects described the diagram of FIG. 8A may not be described.

The memory controller 200a may transmit the command for entering into the command bus training mode in operation S101. The memory device 100a may enter into the command bus training mode in response to the received command in operation S102. The memory device 100a may generate the internal clock signal CK_INT by dividing the clock signal CK received from the memory controller 200a, in operation S103.

The memory controller 200a may transmit the first command/address signal CA1 in operation S104. For example, the memory controller 200a may transmit the first command/address signal CA1 having a specific pattern (e.g., active, precharge, refresh, read, write, etc.). Then, the memory controller 200a may adjust a delay of the first command/address signal CA1 in operation S105. For example, the memory controller 200a may adjust a delay of the first command/address signal CA1 to gradually increase or decrease. In example embodiments, one or more signals of the first command/address signal CA1 may be adjusted by the delay in operation S105. The memory controller 200a may transmit the first command/address signal CA1 in operation S106. For example, the memory controller 200a may transmit the first command/address signal CA1 according to the adjusted delay.

When the first command/address signal CA1 is sampled at the rising edge (or the falling edge) of the internal clock signal CK_INT, the memory device 100a may latch the first command/address signal CA1 in operation S107. It is assumed that the chip selection signal CS has a sufficient margin that does not affect to the training mode operation in operation S107. The memory device 100a may generate the second command/address signal CA2 by latching the first command/address signal CA1, and may transmit the second command/address signal CA2 to the memory controller 200a in operation S108.

The memory controller 200a may compare the first command/address signal CA1 with the second command/address signal CA2 in operation S109, and may accumulate results of the comparison. The memory controller 200a may determine whether to end the command bus training in operation S110. For example, the memory controller 200a may determine whether the delay of the first command/address signal CA1 is adjusted to a maximum value (or a minimum value) which is adjustable. Alternatively, the memory controller 200a may determine whether the delay of the first command/address signal CA1 may be determined based on the accumulated results of the comparison. When the command bus training is not ended, the memory controller 200a may repeat to transmit the first command/address signal in operation S104. In addition, the first command/address signal CA1 may have a different pattern from the previous pattern of the first command/address signal CA1. On the other hand, when the command bus training is complete, the memory controller 200a may transmit a command for ending the command bus training mode to the memory device 100a in operation S111. The memory device 100a may end the command bus training mode in response to the received command in operation S114.

The memory controller 200a may determine the delay of the first command/address signal CA1 based on the accumulated results of the comparison in operation S113. For example, as illustrated in FIG. 6, the memory controller 200a may select the delay of the first command/address signal CA1 corresponding to a median of the first command/address signal CA1 pass window (e.g., (c) of FIG. 6).

Figure 9A:
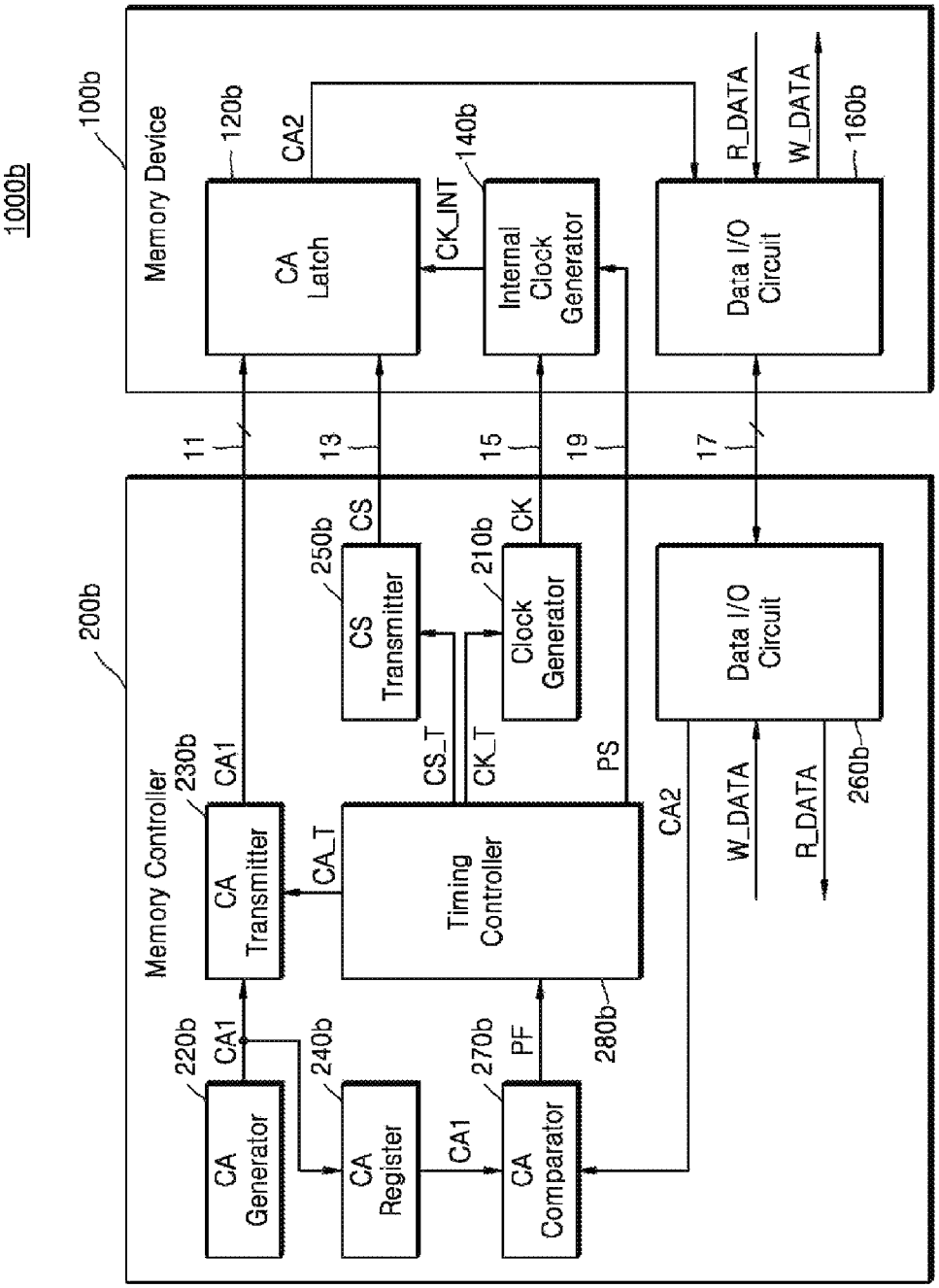
FIGS. 9A and 9B are block diagrams of systems including a memory device and a memory controller, according to exemplary embodiments.
Figure 9B:
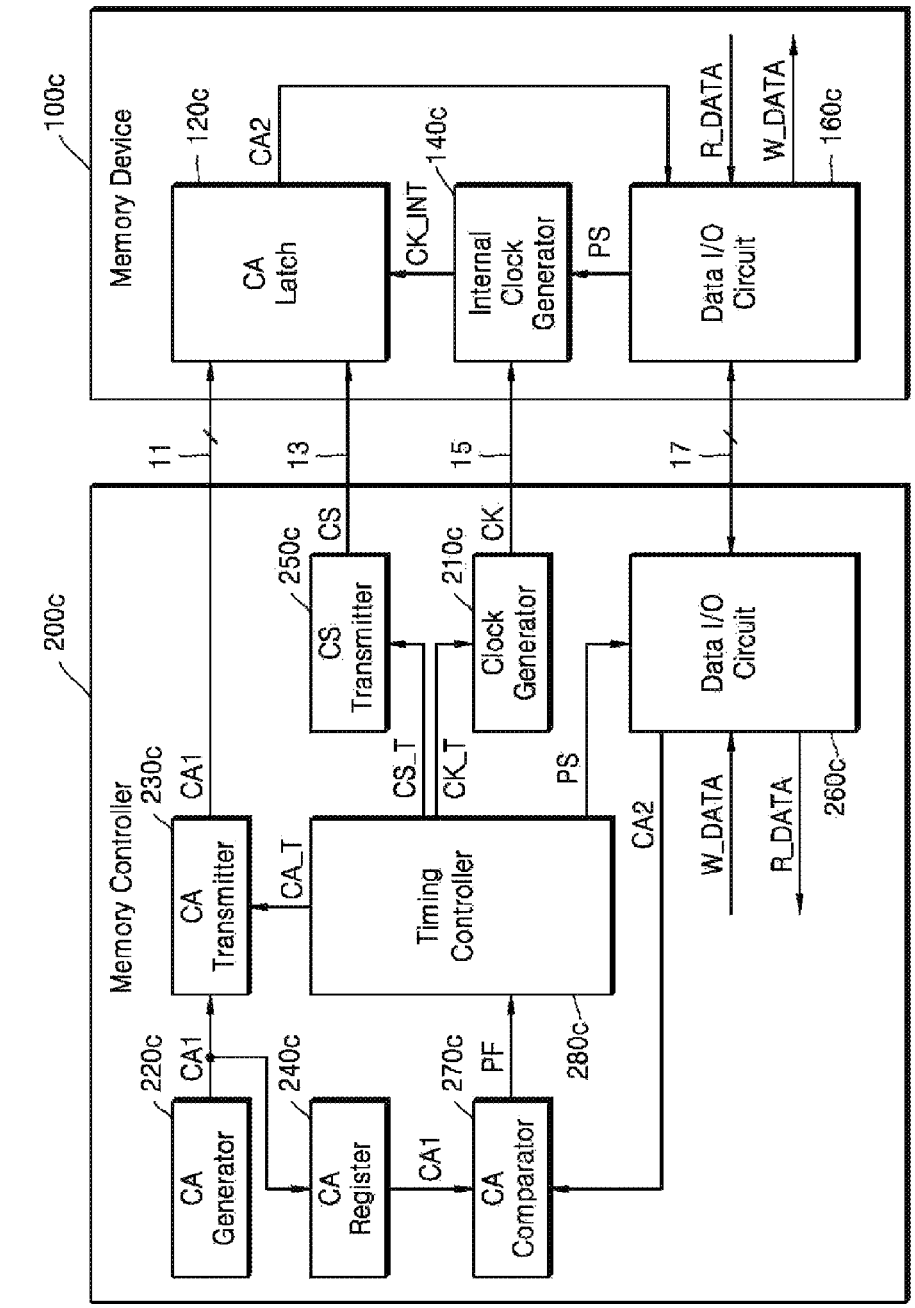

FIGS. 9A and 9B are block diagrams of examples of systems 1000b and 1000c including memory devices 100b and 100c and memory controllers 200b and 200c according to exemplary embodiments. The memory controllers 200b and 200c in the systems 1000b and 1000c illustrated in FIGS. 9A and 9B may transmit a phase selection signal PS to the memory devices 100b and 100c, respectively, through a phase selection line 19. Hereinafter, aspects that are the same or substantially the same as the aspects described for the system 1000a of FIG. 4 may not be described.

Referring to FIG. 9A, the memory device 100b may include a command/address latch 120b, an internal clock generator 140b, and a data input/output circuit 160b. The internal clock generator 140b may receive phase selection signal PS from the memory controller 200b. The internal clock generator 140b may generate a plurality of internal clock signals having different phases with respect to each other, and may select one CK_INT of the plurality of internal clock signals in response to the phase selection signal PS and output the selected internal clock signal CK_INT.

Referring to FIG. 9A, the memory controller 200b may include a clock generator 210b, a command/address generator 220b, a command/address transmitter 230b, a command/address register 240b, a chip selection transmitter 250b, a data input/output circuit 260b, a command/address comparator 270b, and a timing controller 280b. The timing controller 280b may generate the phase selection signal PS and transmit the phase selection signal PS to the memory device 100b through the phase selection line 19. The phase selection line 19 may include one or more signal lines connected to an input pin of the memory device 100b and an output pin of the memory controller 200b, which are not used during the command bus training. For example, the phase selection line 19 may be a signal line connected to a data mask pin (or a pad) of the memory device 100b and the memory controller 200b.

Referring to FIG. 9B, the memory device 100c may include a command/address latch 120c, an internal clock generator 140c, and a data input/output circuit 160c. The data input/output circuit 160c may receive a phase selection signal PS through at least one signal line of the data bus 17, during the command bus training mode. For example, the data bus 17 including a plurality of signal lines may include at least one signal line through which the second command/address signal CA2 output from the memory device 100c is transferred and at least one signal line through which the phase selection signal PS output from the memory controller 200c is transferred.

The internal clock generator 140c may receive the phase selection signal PS from the memory controller 200c. The internal clock generator 140c may generate a plurality of internal clock signals having different phases with respect to each other and may select one CK_INT of the plurality of internal clock signals in response to the phase selection signal PS and output the selected internal clock signal CK_INT. In example embodiments, each of the plurality of internal clock signals may have the same frequency, for example, 1 GHz, 2 GHz, etc.

According to an exemplary embodiment, the phase selection signal PS may be transmitted to the memory device 100b or 100c from the memory controller 200b or 200c by setting a mode register set of the memory device 100b or 100c, unlike the exemplary embodiments illustrated in FIGS. 9A and 9B. For example, the memory controller 200b or 200c may transmit a command for setting the mode register set to the memory device 100b or 100c, and the memory device 100b or 100c may change the phase selection signal PS that is input to the internal clock generator 140b or 140c in response to the received command.

In example embodiments illustrated in FIGS. 9A and 9B, each of the plurality of internal clock signals CK_INT may have the same frequency (e.g., 1 GHz) by dividing the clock signal CK (e.g., 2 GHz, 4 GHz, etc.), and may have a different phase with respect to each other (e.g., 90°, 180°, 270°, etc.).

Figure 10:
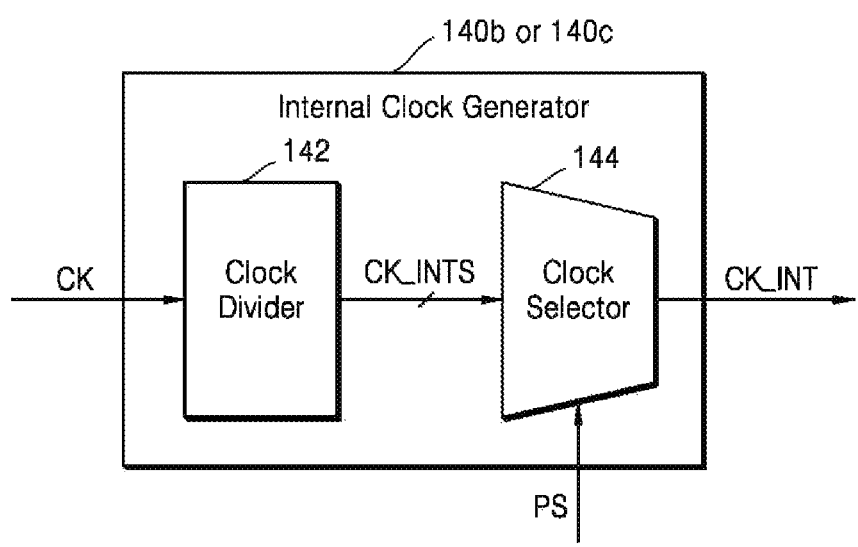
FIG. 10 is a block diagram of an example of an internal clock generator according to exemplary embodiments.

FIG. 10 is a block diagram of an example of an internal clock generator according to an exemplary embodiment. For example, FIG. 10 illustrates the internal clock generator 140b or 140c of FIG. 9A or 9B. As described above with reference to FIGS. 9A and 9B, the internal clock generator 140b or 140c may receive a clock signal CK from the memory controller 200b or 200c, and may receive a phase selection signal PS from the memory controller 200b or the data input/output circuit 160c.

Referring to FIG. 10, the internal clock generator 140b or 140c may include a clock divider 142 and a clock selector 144. The clock divider 142 may generate a plurality of internal clock signals CK_INTS by dividing the clock signal CK. According to an embodiment, the plurality of internal clock signals CK_INTS may have the same frequencies and different phases with one another. For example, similarly to the illustration of FIG. 5, the clock divider 142 may generate four internal clock signals CK_INTS having a frequency that is ¼ of a frequency of the clock signal CK, and the four internal clock signals CK_INTS may have a phase difference of 90° with one another. As another example, the clock divider 142 may generate two internal clock signals CK_INTS having a frequency that is ½ of the frequency of the clock signal CK, and the two internal clock signals CK_INTS may have a phase difference of 180° with respect to each other.

The clock selector 144 may select one of the plurality of internal clock signals CK_INTS generated by the clock divider 142 and output the selected internal clock signal as the internal clock signal CK_INT, in response to the phase selection signal PS generated by the memory controller 200b or 200c. For example, when the number of internal clock signals CK_INTS generated by the clock divider 142 is four, the phase selection signal PS may be a 2 bit signal received through two signal lines, and the clock selector 144 may select one of the four internal clock signals CK_INTS and output the selected internal clock signal as the internal clock signal CK_INT in response to the phase selection signal PS.

Figure 11:
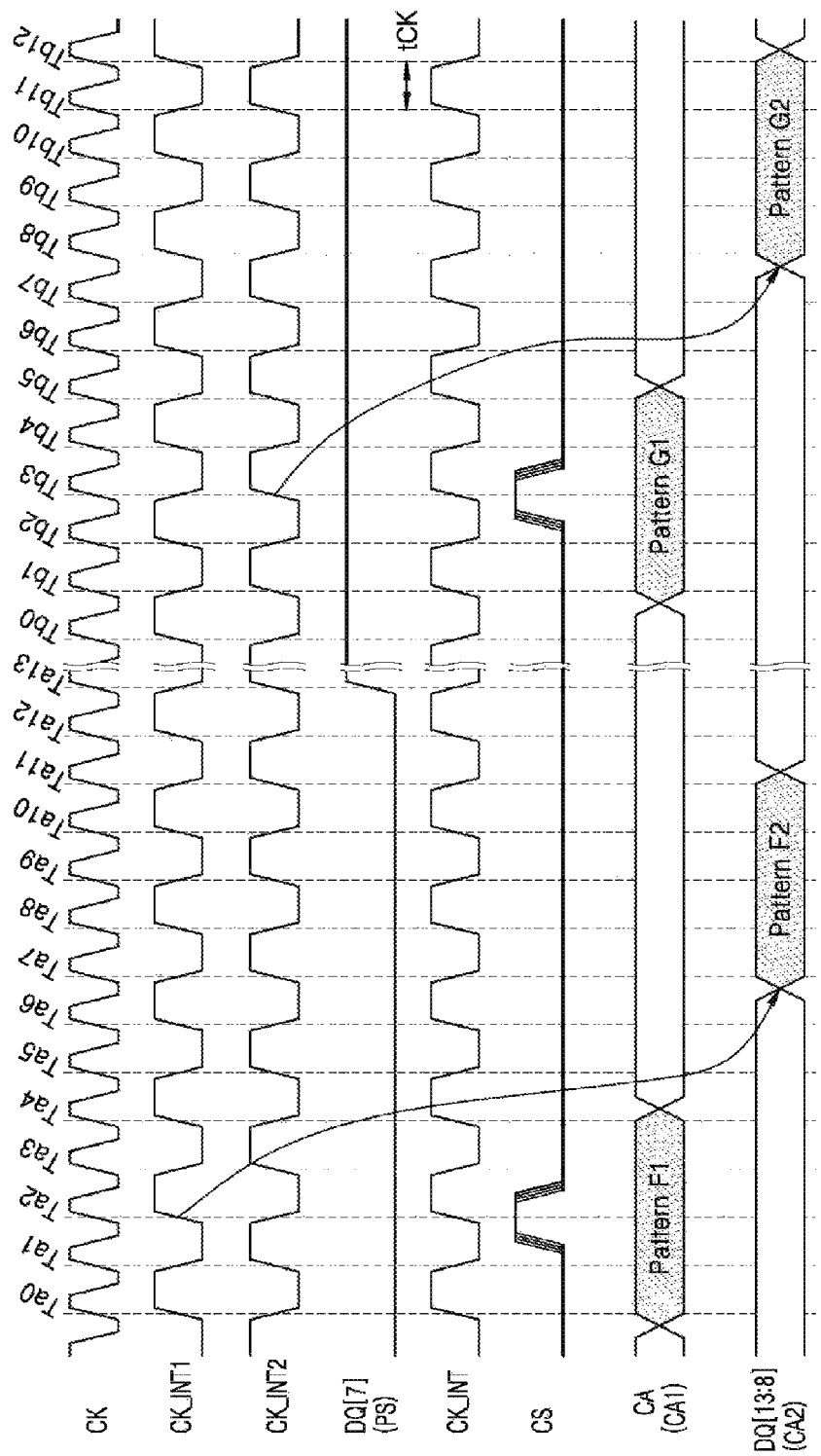
FIG. 11 is an exemplary timing diagram of signals transferred between the memory device and the memory controller of FIG. 9B during command bus training, according to exemplary embodiments.

FIG. 11 is an exemplary timing diagram of signals transferred between the memory device 100c and the memory controller 200c of FIG. 9B during command bus training, according to an exemplary embodiment. FIG. 11 is the timing diagram corresponding to the example of FIG. 9B in which the phase selection signal PS is transferred through one signal line (that is, DQ [7]) of the data bus 17. Alternatively, in the example of FIG. 9A in which the phase selection signal PS is transferred through an additional signal line, the signals are transferred similarly to the example of FIG. 11. Hereinafter, FIG. 11 will be described with reference to FIGS. 9B and 10.

Referring to FIG. 11, the clock divider 142 of the internal clock generator 140c may generate two internal clock signals CK_INT1 and CK_INT2 having a frequency that is ½ of a frequency of the clock signal CK. The two internal clock signals CK_INT1 and CK_INT2 may have a phase difference of 180° with respect to each other, and the clock selector 144 may select one of the two internal clock signals CK_INT1 and CK_INT2 and output the selected internal clock signal in response to the phase selection signal PS.

At Ta0 through Ta12, a first internal clock signal CK_INT1 may be selected and output to the outside of the internal clock generator 140c, in response to the phase selection signal PS of a low level, and the command/address latch 120c may sample a chip selection signal CS at a rising edge of the first internal clock signal CK_INT1. As illustrated in FIG. 11, an active pulse of the chip selection signal CS received from the memory controller 200c may be sampled at Ta2, and thus, the command/address latch 120c may latch a first command/address signal CA1 having Pattern F1, and may output a second command/address signal CA2 having Pattern F2.

Also, at Tb0 through Tb12, a second internal clock signal CK_INT2 may be selected and output to the outside of the internal clock generator 140c, in response to the phase selection signal PS of a high level, and the command/address latch 120c may sample the chip selection signal CS at a rising edge of the second internal clock signal CK_INT2. As illustrated in FIG. 11, an active pulse of the chip selection signal CS received from the memory controller 200c may be sampled at Tb3, and thus, the command/address latch 120c may latch a first command/address signal CA1 having Pattern G1, and may output a second command/address signal CA2 having Pattern G2.

As illustrated in FIG. 11, the internal clock signal capturing the chip selection signal CS and the first command/address signal CA1 may be determined in response to the phase selection signal PS provided by the memory controller 120c. Accordingly, in the case where the rising edge of the internal clock signal CK_INT divided from the clock signal CK does not occur in a range within which the memory controller 120c changes a delay of the chip selection signal CS, so that the second command/address signal CA2 having the pattern identical to the pattern of the first command/address signal CA1 is not received, or in the case where the rising edge of the internal clock signal CK_INT occurs near a boundary of the range within which the memory controller 120c changes the delay of the chip selection signal CS so that an optimal timing of the chip selection signal CS is not found, the memory controller 120c may change a phase of the internal clock signal CK_INT sampling the chip selection signal CS, by changing the phase selection signal PS.

Figure 12:
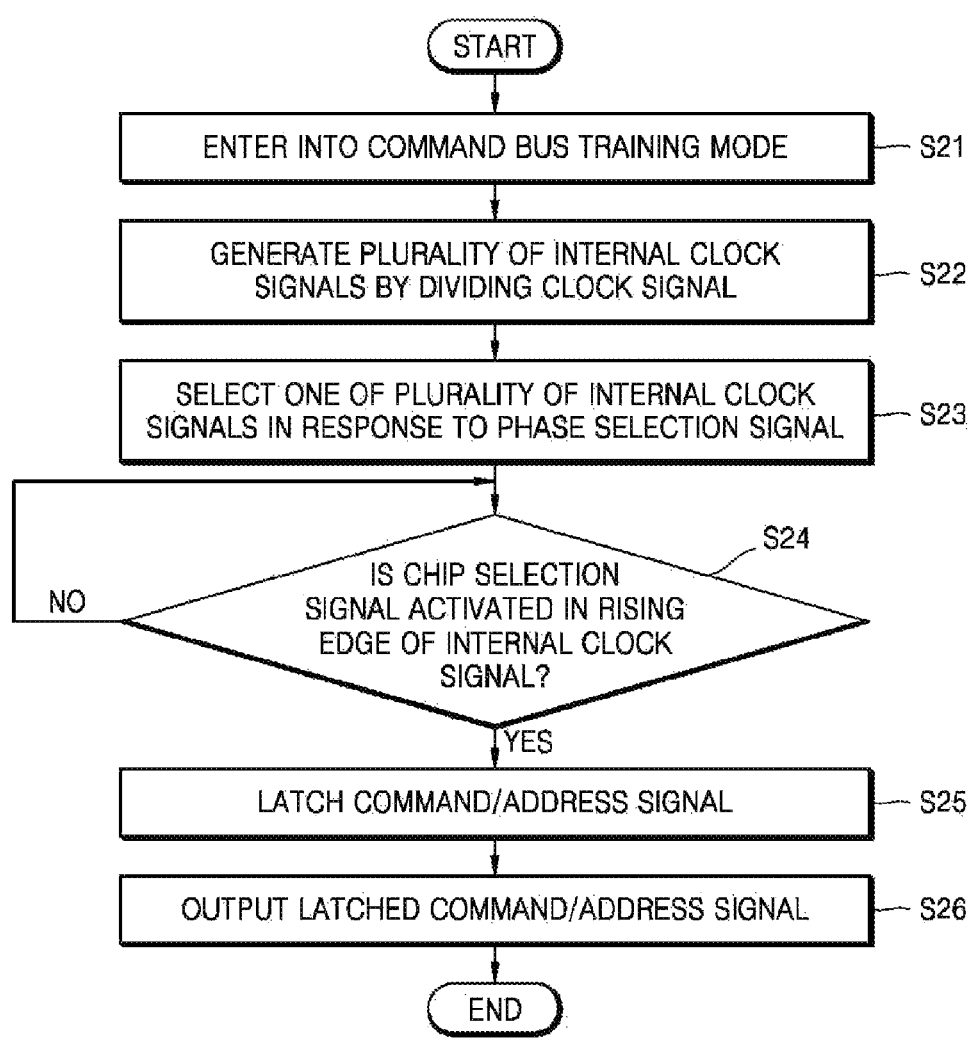
FIG. 12 is a flowchart of an operating method of the memory device of FIG. 9A or FIG. 9B, according to exemplary embodiments.

FIG. 12 is a flowchart of an operating method of the memory device 100b or 100c of FIG. 9A or 9B, according to example embodiments. As illustrated in FIG. 12, the operating method of the memory device 100b or 100c may include operations S21 through S26. Hereinafter, FIG. 12 will be described with reference to FIG. 9A.

In operation S21, an operation of entering into a command bus training mode may be performed. For example, the memory controller 200b may transmit a command for entering into a command bus training mode to the memory device 100b, and the memory device 100b may enter into the command bus training mode in response to the received command.

In operation S22, an operation of generating a plurality of internal clock signals CK_INTS by dividing the clock signal CK may be performed. For example, the clock divider 142 included in the internal clock generator 140b may generate the plurality of internal clock signals CK_INTS having the same frequencies and having different phases with respect to each other.

In operation S23, an operation of selecting one of the plurality of internal clock signals CK_INTS in response to the phase selection signal PS may be performed. For example, the clock selector 144 included in the internal clock generator 140b may receive the phase selection signal PS, and may output one of the plurality of internal clock signals CK_INTS as the internal clock signal CK_INT in response to the received phase selection signal PS.

In operation S24, an operation of determining whether the chip selection signal CS is activated or not at a rising edge (or a falling edge) of the internal clock signal CK_INT may be performed. When the chip selection signal CS is activated at the rising edge of the internal clock signal CK_INT, an operation of latching a command/address signal may be performed in operation S25. For example, the command/address latch 120b of the memory device 100b may receive the chip selection signal CS, the first command/address signal CA1, and the internal clock signal CK_INT, and when the chip selection signal CS is activated at the rising edge of the internal clock signal CK_INT, the command/address latch 120b of the memory device 100b may latch the first command/address signal CA1 to generate the second command/address signal CA2.

In operation S26, an operation of outputting the latched command/address signal may be performed. For example, the data input/output circuit 160b of the memory device 100b may receive the second command/address signal CA2 from the command/address latch 120b, and may transmit the second command/address signal CA2 to the memory controller 200b through some signal lines of the data bus 17.

Figure 13A:
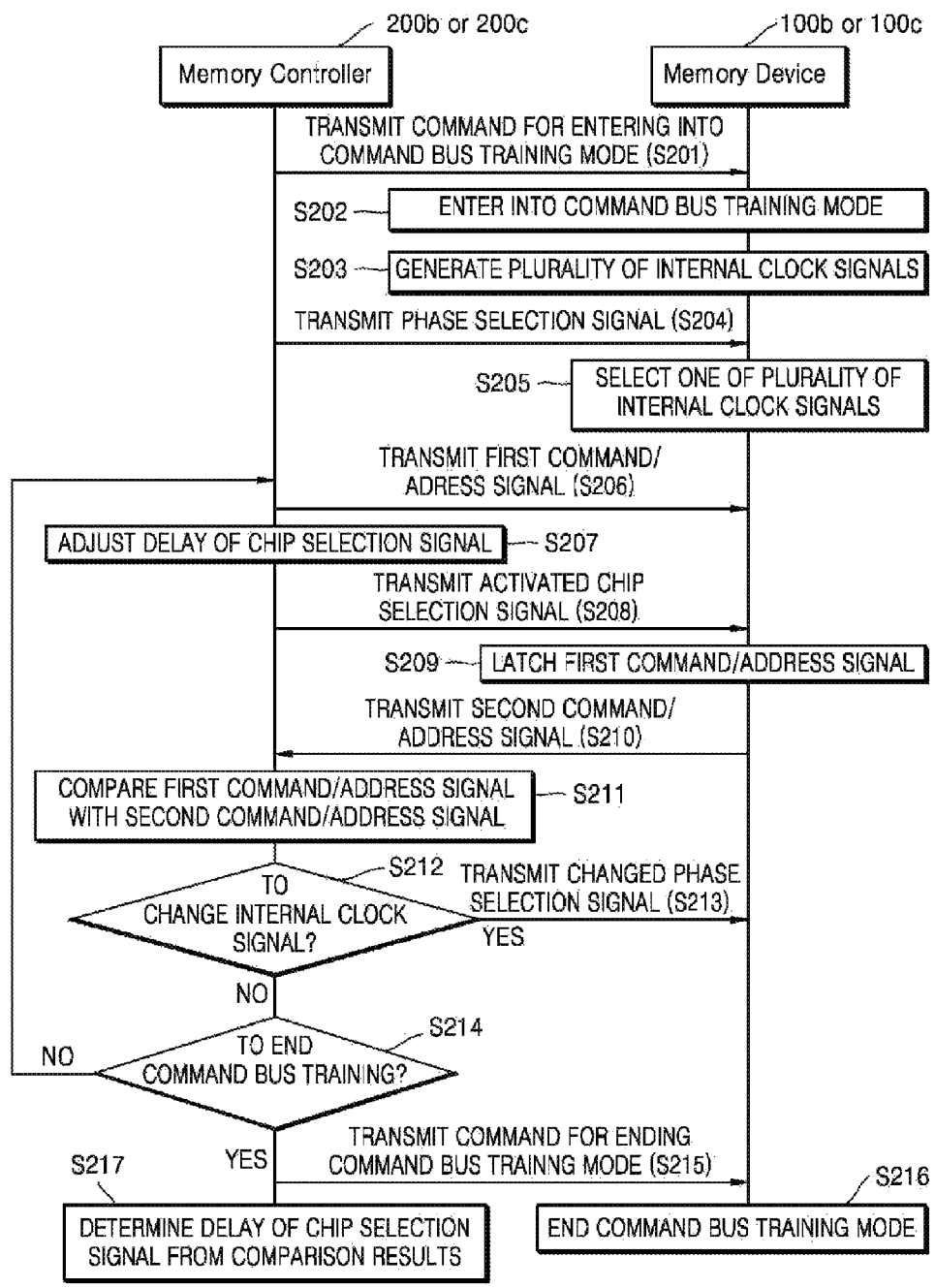
FIG. 13A is a diagram for describing an operation between the memory device and the memory controller of FIG. 9A or 9B according to the passage of time, according to exemplary embodiments.

FIG. 13A is a diagram for describing an operation between the memory device 100b or 100c and the memory controller 200b or 200c of FIG. 9A or 9B according to the passage of time, according to example embodiments. Hereinafter, FIG. 13A will be described with reference to FIG. 9A.

The memory controller 200b may transmit the command for entering into the command bus training mode in operation S201. The memory device 100b may enter into the command bus training mode in response to the received command in operation S202. The memory device 100b may generate the plurality of internal clock signals CK_INTS by dividing the clock signal CK received from the memory controller 200b, in operation S203. The plurality of internal clock signals may have different phases from one another.

The memory controller 200b may transmit the phase selection signal PS in operation S204. For example, the memory controller 200b may transmit the phase selection signal PS through, for example, a data mask pad (or data mask pin) which is not used in the command bus training mode, and the memory device 100b may receive the phase selection signal PS through the data mask pad and select one of the plurality of internal clock signals in response to the received phase selection signal in operation S205.

The memory controller 200b may transmit the first command/address signal CA1 in operation S206. For example, the memory controller 200b may transmit the first command/address signal CA1 having a specific pattern (e.g., active, precharge, refresh, read, write, etc.). Then, the memory controller 200b may adjust a delay of the chip selection signal CS in operation S207. For example, the memory controller 200b may adjust a delay of an active pulse of the chip selection signal CS to gradually increase or decrease. The memory controller 200b may transmit the activated chip selection signal CS in operation S208. For example, the memory controller 200b may transmit the active pulse of the chip selection signal CS according to the adjusted delay.

When the memory device 100b samples the chip selection signal CS activated at a rising edge (or, falling edge) of the internal clock signal CK_INT, the memory device 100b may latch the first command/address signal CA1 in operation S209. The memory device 100b may generate the second command/address signal CA2 by latching the first command/address signal CA1, and may transmit the second command/address signal CA2 to the memory controller 200b in operation S210.

The memory controller 200b may compare the first command/address signal CA1 with the second command/address signal CA2 in operation S211, and may accumulate results of the comparison. The memory controller 200b may determine whether to change the internal clock signal CK_INT in operation S212. For example, as described above with reference to FIG. 11, when it is difficult to determine an optimal timing of the chip selection signal CS by using a first internal clock signal CK_INT, the memory controller 200b may determine to change the first internal clock signal CK_INT into a second internal clock signal CK_INT having a different phase (e.g., 180°) with respect to the first internal clock signal CK_INT, and may transmit a changed phase selection signal in operation S213.

The memory controller 200b may determine whether to end the command bus training in operation S214. For example, the memory controller 200b may determine whether the delay of the chip selection signal CS is adjusted to a maximum value (or a minimum value) which is adjustable. Alternatively, the memory controller 200b may determine whether the delay of the chip selection signal CS may be determined based on the accumulated results of the comparison. When the command bus training is not ended, the memory controller 200b may repeat to transmit the first command/address signal CA1 in operation S206. For example, the first command/address signal CA1 may have a different pattern from the previous first command/address signal CA1. On the other hand, when the command bus training is ended, the memory controller 200b may transmit a command for ending the command bus training mode to the memory device 100b in operation S215. The memory device 100b may end the command bus training mode in response to the received command in operation S216.

The memory controller 200b may determine the delay of the chip selection signal CS based on the accumulated results of the comparison in operation S217. For example, as illustrated in FIG. 6, the memory controller 200b may select the delay of the chip selection signal CS corresponding to a middle of the CS pass window (e.g., (c) of FIG. 6).

Figure 13B:
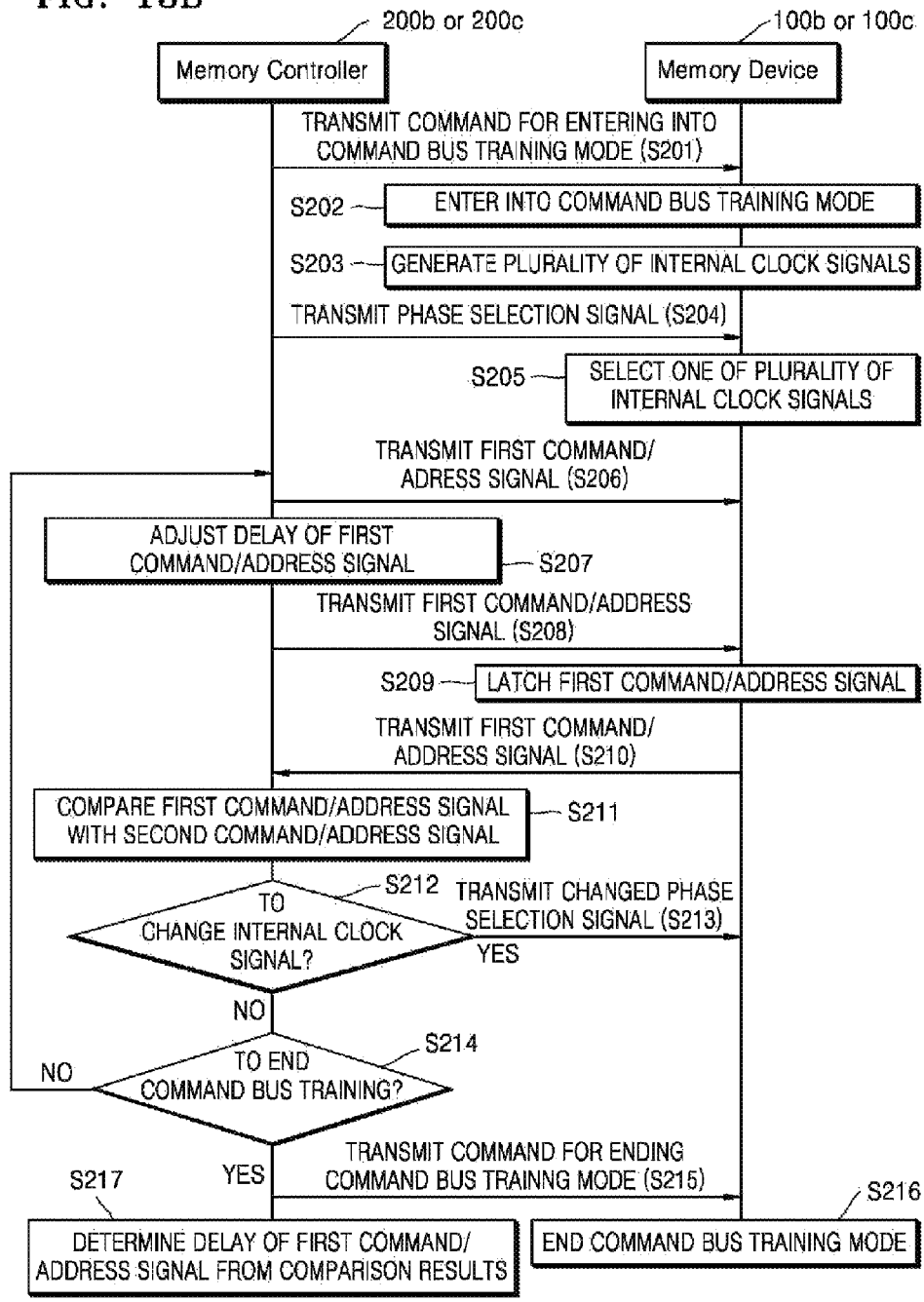
FIG. 13B is a diagram for describing an operation between the memory device and the memory controller of FIG. 9A or 9B according to exemplary embodiments.

FIG. 13B is a diagram for describing an operation between the memory device 100b or 100c and the memory controller 200b or 200c of FIG. 9A or 9B according to example embodiments. Hereinafter, FIG. 13B will be described with reference to FIG. 9A.

The memory controller 200b may transmit the command for entering into the command bus training mode in operation S201. The memory device 100b may enter into the command bus training mode in response to the received command in operation S202. The memory device 100b may generate the plurality of internal clock signals CK_INTS by dividing the clock signal CK received from the memory controller 200b, in operation S203. The plurality of internal clock signals may have different phases from one another.

The memory controller 200b may transmit the phase selection signal PS in operation S204. For example, the memory controller 200b may transmit the phase selection signal PS through, for example, a data mask pad (or data mask pin) which is not used in the command bus training mode, and the memory device 100b may receive the phase selection signal PS through the data mask pad and select one of the plurality of internal clock signals in response to the received phase selection signal in operation S205.

The memory controller 200b may transmit the first command/address signal CA1 in operation S206. For example, the memory controller 200b may transmit the first command/address signal CA1 having a specific pattern (e.g., active, precharge, refresh, read, write, etc.). Then, the memory controller 200b may adjust a delay of the first command/address signal CA1 in operation S207. For example, the memory controller 200b may adjust a delay of the first command/address signal CA1 to gradually increase or decrease. In example embodiments, one or more signals of the first command/address signal CA1 may be adjusted by the delay in operation S207. The memory controller 200b may transmit the first command/address signal CA1 in operation S208. For example, the memory controller 200b may transmit the first command/address signal CA1 according to the adjusted delay.

When the memory device 100b samples the first command/address signal CA1 at a rising edge (or, falling edge) of the internal clock signal CK_INT, the memory device 100b may latch the first command/address signal CA1 in operation S209. The memory device 100b may generate the second command/address signal CA2 by latching the first command/address signal CA1, and may transmit the second command/address signal CA2 to the memory controller 200b in operation S210.

The memory controller 200b may compare the first command/address signal CA1 with the second command/address signal CA2 in operation S211, and may accumulate results of the comparison. The memory controller 200b may determine whether to change the internal clock signal CK_INT in operation S212. For example, as described above with reference to FIG. 11, when it is difficult to determine an optimal timing of the first command/address signal CA1 by using a first internal clock signal CK_INT, the memory controller 200b may determine to change the first internal clock signal CK_INT into a second internal clock signal CK_INT having a different phase (e.g., 180°) with respect to the first internal clock signal CK_INT, and may transmit a changed phase selection signal in operation S213.

The memory controller 200b may determine whether to end the command bus training in operation 5214. For example, the memory controller 200b may determine whether the delay of the first command/address signal CA1 is adjusted to a maximum value (or a minimum value) which is adjustable. Alternatively, the memory controller 200b may determine whether the delay of the first command/address signal CA1 may be determined based on the accumulated results of the comparison. When the command bus training is not ended, the memory controller 200b may repeat to transmit the first command/address signal CA1 in operation S206. For example, the first command/address signal CA1 may have a different pattern from the previous first command/address signal CA1. On the other hand, when the command bus training is complete, the memory controller 200b may transmit a command for ending the command bus training mode to the memory device 100b in operation S215. The memory device 100b may end the command bus training mode in response to the received command in operation S216.

The memory controller 200b may determine the delay of the first command/address signal CA1 based on the accumulated results of the comparison in operation S217. For example, as illustrated in FIG. 6, the memory controller 200b may select the delay of the first command/address signal CA1 corresponding to a middle of the first command/address signal CA1 pass window (e.g., (c) of FIG. 6)

Figure 14:
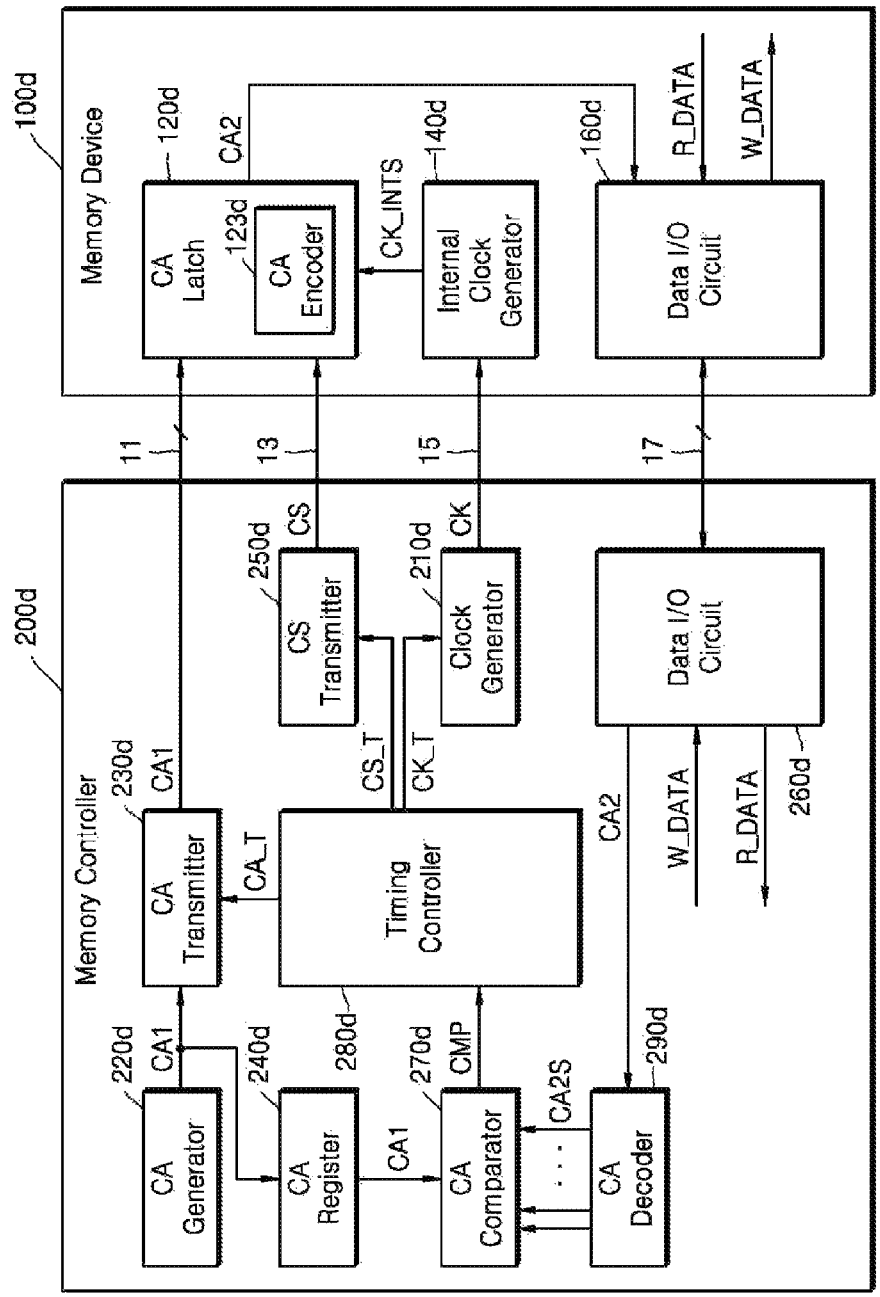
FIG. 14 is a block diagram of a system including a memory device and a memory controller according to exemplary embodiments.

FIG. 14 is a block diagram of a system 1000d including a memory device 100d and a memory controller 200d according to exemplary embodiments. In the system 1000d illustrated in FIG. 14, the memory device 100d may generate a second command/address signal CA2 by encoding a received first command/address signal CA1, and the memory controller 200d may compare a decoded signal of the second command/address signal CA2 with the first command/address signal CA1. Hereinafter, aspects that are the same or substantially the same as the aspects of the system 1000a of FIG. 4 will not be described.

Referring to FIG. 14, the memory device 100d may include a command/address latch 120d, an internal clock generator 140d, and a data input/output circuit 160d. The internal clock generator 140d may generate a plurality of internal clock signals CK_INTS and provide the plurality of internal clock signals CK_INTS to the command/address latch 120d. The command/address latch 120d may include a command/address encoder 123d, and the command/address encoder 123d may differently encode the first command/address signal CA1 according to the plurality of internal clock signals CK_INTS received from the internal clock generator 140d to generate the second command/address signal CA2. Detailed aspects with respect to the command/address encoder 123d will be described later with reference to FIG. 15.

The memory controller 200d may include a clock generator 210d, a command/address generator 220d, a command/address transmitter 230d, a command/address register 240d, a chip selection transmitter 250d, a data input and output circuit 260d, a command/address comparator 270d, a timing controller 280d, and a command/address decoder 290d. The command/address decoder 290d may decode the second command/address signal CA2 received from the memory device 100d to generate a plurality of decoded second command/address signals CA2S. Each of the plurality of decoded second command/address signals CA2S may correspond to one of signals which are possible to be output from the memory device 100d. The command/address comparator 270d may output a comparison signal CM' by comparing the first command/address signal CA1 with each of the plurality of decoded second command/address signals CA2S. Based on the comparison signal CM', the timing controller 280d may detect the second command/address signal CA2 from among the plurality of decoded second command/address signals CA2S, which corresponds to the first command/address signal CA1, and may determine a timing of the chip selection signal CS according to a result of the detection. Detailed aspects with respect to the operation of determining the timing of the chip selection signal CS in the system 1000d of FIG. 14 will be described later with reference to FIGS. 16A, 16B, 16C, 17A, and 17B.

Figure 15:
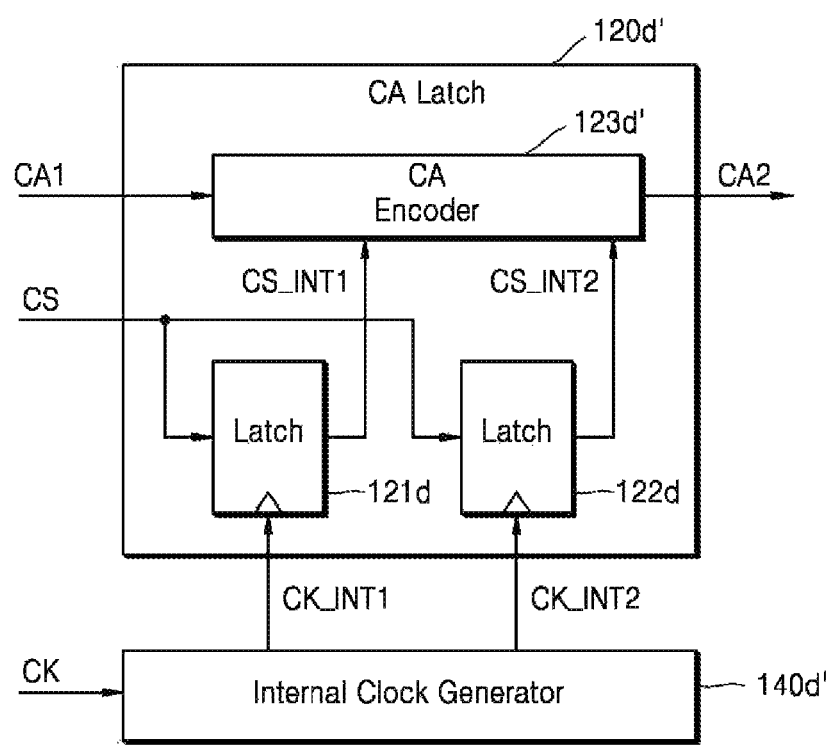
FIG. 15 is a block diagram of examples of a command/address latch and an internal clock generator of FIG. 14, according to exemplary embodiments.

FIG. 15 is a block diagram of examples 120d' and 140d' of the command/address latch 120d and the internal clock generator 140d of FIG. 14, according to exemplary embodiments. As illustrated in FIG. 15, the command/address latch 120d' may receive a first command/address signal CA1 and a chip selection signal CS, and the internal clock generator 140d' may receive a clock signal CK.

Referring to FIG. 15, the internal clock generator 140d' may generate first and second internal clock signals CK_INT1 and CK_INT2 having different phases by dividing the clock signal CK and provide the first and second internal clock signals CK_INT1 and CK_INT2 to the command/address latch 120d'. For example, as illustrated in FIG. 11, the first and second internal clock signals CK_INT1 and CK_INT2 may be generated by dividing the clock signal CK by two and may have a phase difference of 180 degrees.

The command/address latch 120d' may include first and second latches 121d and 122d and a command/address encoder 123d'. The first latch 121d may generate a first internal chip selection signal CS_INT1 by latching the chip selection signal CS at a rising edge (or a falling edge) of the first internal clock signal CK_INT1. Also, the second latch 122d may generate a second internal chip selection signal CS_INT2 by latching the chip selection signal CS at a rising edge (or a falling edge) of the second internal clock signal CK_INT2. The first and second internal chip selection signals CS_INT1 and CS_INT2 may be provided to the command/address encoder 123d'.

The command/address encoder 123d' may generate a second command/address signal CA2 by encoding the first command/address signal CA1 based on the first and second internal chip selection signals CS_INT1 and CS_INT2. For example, as it will be described later with reference to FIGS. 16A, 16B, and 16C the first and second internal chip selection signals CS_INT1 and CS_INT2 may be generated when the chip selection signal CS is latched by the first and second internal clock signals CK_INT1 and CK_INT2 having different phases, and thus, combinations of levels of the first and second internal chip selection signals CS_INT1 and CS_INT2 may be finite. The command/address encoder 123d' may generate the second command/address signal CA2 by differently encoding the first command/address signal CA1, according to the combinations of levels of the first and second internal chip selection signals CS_INT1 and CS_INT2.

FIG. 15 illustrates the example in which the internal clock generator 140d' generates the two internal clock signals CK_INT1 and CK_INT2 and provides the internal clock signals CK_INT1 and CK_INT2 to the command/address latch 120d'. However, the present inventive concept is not limited thereto. That is, according to exemplary embodiments, the internal clock generator 140d of FIG. 14 may generate three or more than three internal clock signals CK_INTS, and the command/address encoder 123d of the command/address latch 120d may generate the second command/address signal CA2 by differently encoding the first command/address signal CA1 according to combinations of levels of the three or more than three internal clock signals CK_INTS.

Figure 16A:
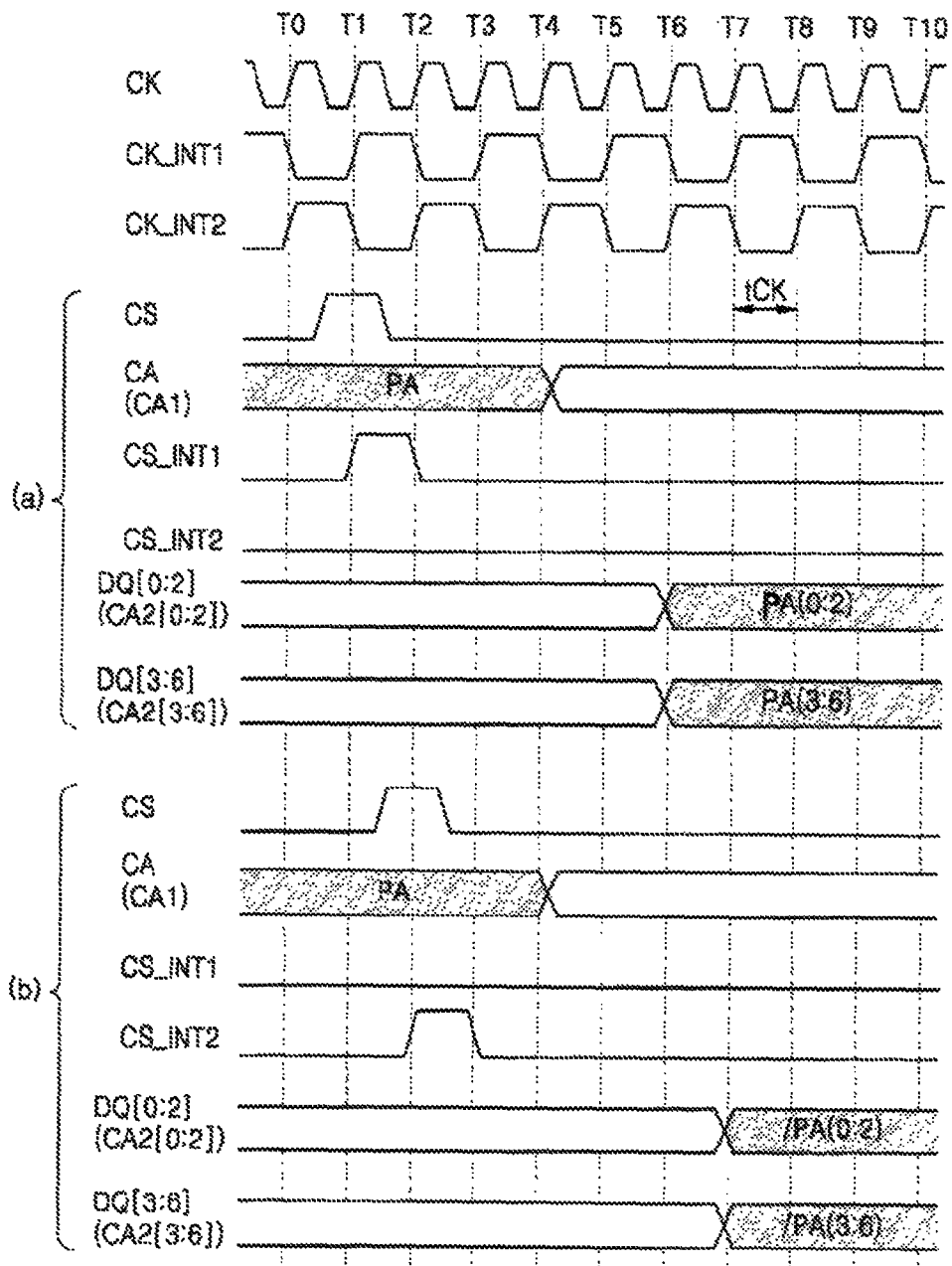
FIGS. 16A, 16B, and 16C are exemplary timing views of signals moving between the memory device and the memory controller of FIG. 14 during command bus training, according to exemplary embodiments.
Figure 16B:
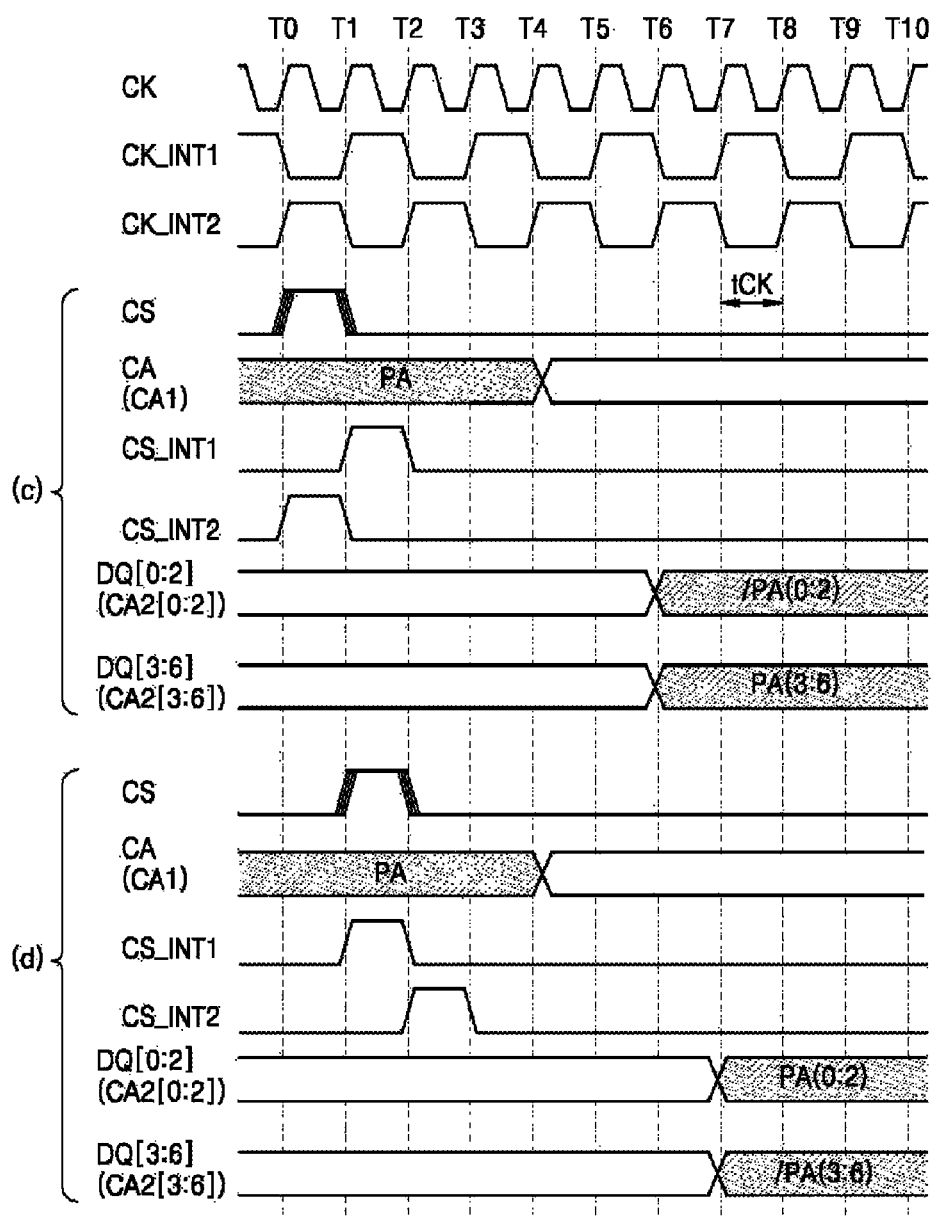
Figure 16C:
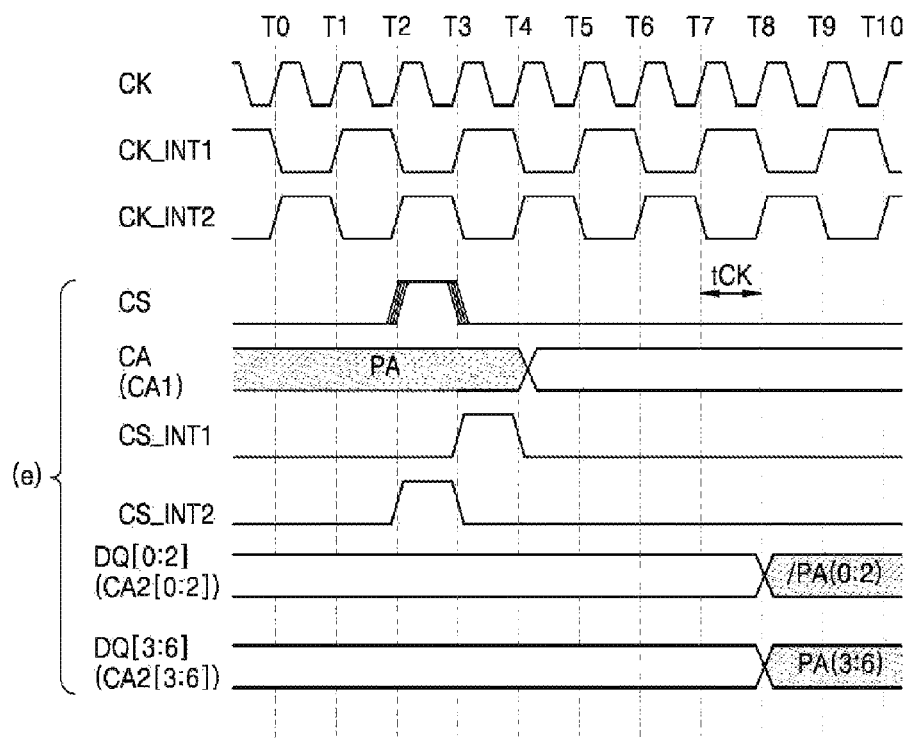
Figure 17B:
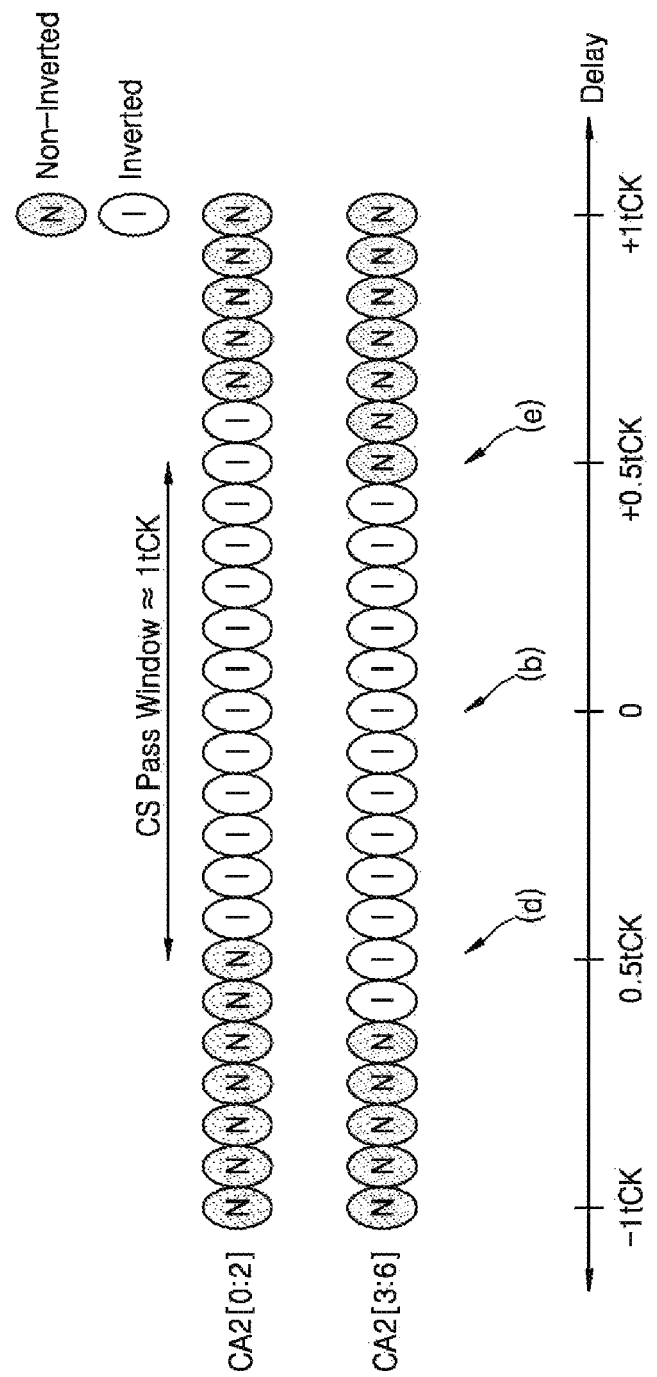

FIGS. 16A, 16B, and 16C are exemplary timing diagrams of signals transferred between the memory device 100d and the memory controller 200d of FIG. 14 during command bus training, according to exemplary embodiments. FIGS. 17A and 17B are diagrams for describing an operation of determining a timing of the chip selection signal CS by the memory controller 200d. In detail, FIGS. 16A, 16B, and 16C are timing diagrams of signals when the memory device 100d of FIG. 14 includes the command/address latch 120d' and the internal clock generator 140d' of FIG. 15. Hereinafter, FIGS. 16A, 16B, 16C, 17A, and 17B will be described by referring to FIGS. 14 and 15.

Referring to (a) of 16A, the memory controller 200d may transmit a first command/address signal CA1 having a pattern PA through the command/address bus 11, and may transmit a chip selection signal CS, a middle of an active pulse of which is located near T1. Accordingly, a first internal chip selection signal CS_INT1 may be activated (for example, a high level) at T1 by the first latch 121d, while a second internal chip selection signal CS_INT2 may be maintained as a non-activated state (for example, a low level). The command/address encoder 123d' may generate a second command/address signal CA2 having a pattern PA the same as the pattern PA of the first command/address signal CA1, in response to the activated first chip selection signal CS_INT1 and the non-activated second internal chip selection signal CS_INT2, and the memory device 100d may transmit the second command/address signal CA2 to the memory controller 200d. Accordingly, the memory controller 200d may determine that the active pulse of the chip selection signal CS is latched at a rising edge of a first internal clock signal CK_INTL based on the pattern of the second command/address signal CA2.

Referring to (b) of FIG. 16A, the memory controller 200d may transmit a first command/address signal CA1 having a pattern PA through the command/address bus 11, and may transmit a chip selection signal CS having a rising edge near T2. Accordingly, while the second internal chip selection signal CS_INT2 may be activated at T2 by the second latch 122d, the first internal chip selection signal CS_INT1 may be maintained as a non-activated state. In response to the non-activated first internal chip selection signal CS_INT1 and the activated second internal chip selection signal CS_INT2, the command/address encoder 123d' may generate a second command/address signal CA2 having a pattern/PA which is a inverted pattern of the pattern PA of the first command/address signal CA1, and the memory device 100d may transmit the second command/address signal CA2 to the memory controller 200d. Accordingly, the memory controller 200d may determine that an active pulse of the chip selection signal CS is latched at a rising edge of a second internal clock signal CK_INT2 based on the pattern of the second command/address signal CA2.

Referring to (c) of FIG. 16B, the memory controller 200d may transmit a first command/address signal CA1 having a pattern PA through the command/address bus 11, and may transmit a chip selection signal CS having a rising edge near T0 and a falling edge near T1. Accordingly, while a second internal chip selection signal CS_INT2 may be activated at T0 by the second latch 122d of FIG. 15, a first internal chip selection signal CS_INT1 may be activated at T1 by the first latch 121d. In response to the second internal chip selection signal CS_INT2 which is first activated, and the first internal chip selection signal CS_INT1 which is thereafter activated, the command/address encoder 123d' may generate a second command/address signal CA2 having a pattern/PA [0:2] & PA [3:6] which is a partially inverted pattern of the pattern of the first command/address signal CA1, and the memory device 100d may transmit the second command/address signal CA2 to the memory controller 200d. Accordingly, the memory controller 200d may determine that an active pulse of the chip selection signal CS is between a rising edge of a second internal clock signal CK_INT2 and a rising edge of a first internal clock signal CK_INTL based on the pattern of the second command/address signal CA2.

Referring to (d) of FIG. 16B, the memory controller 200d may transmit a first command/address signal CA1 having a pattern PA through the command/address bus 11, and may transmit a chip selection signal CS having a rising edge near T1 and a falling edge near T2. Accordingly, while a first internal chip selection signal CS_INT1 may be activated at T1 by the first latch 121d of FIG. 15, a second internal chip selection signal CS_INT2 may be activated at T2 by the second latch 122d. In response to the first internal chip selection signal CS_INT1 which is first activated and the second internal chip selection signal CS_INT2 which is thereafter activated, the command/address encoder 123d may generate a second command/address signal CA2 having a pattern PA [0:2] & /PA [3:6] which is a partially inverted pattern of the pattern of the first command/address signal CA1, and the memory device 100d may transmit the second command/address signal CA2 to the memory controller 200d. Accordingly, the memory controller 200d may determine that an active pulse of the chip selection signal CS is between a rising edge of a first internal clock signal CK_INT1 and a rising edge of a second internal clock signal CK_INT2, based on the pattern of the second command/address signal CA2.

Referring to (e) of FIG. 16C, the memory controller 200*d* may transmit a first command/address signal CA1 having a pattern PA through the command/address bus 11, and may transmit a chip selection signal CS having a rising edge near T2 and a falling edge near T3. Accordingly, while a second internal chip selection signal CS_INT2 may be activated at T2 by the second latch 122*d* of FIG. 15, a first internal chip selection signal CS_INT1 may be activated at T3 by the first latch 121*d*. In response to the second internal chip selection signal CS_INT2 which is first activated, and the first internal chip selection signal CS_INT1 which is thereafter activated, the command/address encoder 123*d'* may generate a second command/address signal CA2 having a pattern/PA [0:2] & PA [3:6] which is a partially inverted pattern of the pattern of the first command/address signal CA1, and the memory device 100*d* may transmit the second command/address signal CA2 to the memory controller 200*d*. Accordingly, the memory controller 200*d* may determine that an active pulse of the chip selection signal CS is between a rising edge of a second internal clock signal CK_INT2 and a rising edge of a first internal clock signal CK_INTL based on the pattern of the second command/address signal CA2.

FIG. 17A illustrates patterns of the second command/address signal CA2 corresponding to a plurality of different delays of the chip selection signal CS, and comparison results, when it is assumed that a delay of the chip selection signal CS illustrated in (a) of FIG. 16A is 0. As illustrated in FIG. 17A, when the delay of the chip selection signal CS is proximate to 0, the second command/address signal CA2 may have a pattern the same as a pattern of the first command/address signal CA1. Also, when the delay of the chip selection signal CS is proximate to −0.5 tCK (for example, (c) of FIG. 16B) or to +0.5 tCK (for example, (d) of FIG. 16B), the second command/address signal CA2 may have a partially (that is, only some bits) inverted pattern of the pattern of the first command/address signal CA1.

FIG. 17B illustrates patterns of the second command/address signal CA2 corresponding to a plurality of different delays of the chip selection signal CS, and comparison results, when it is assumed that a delay of the chip selection signal CS illustrated in (b) of FIG. 16A is 0. As illustrated in FIG. 17B, when the delay of the chip selection signal CS is proximate to 0, the second command/address signal CA2 may have a inverted pattern of a pattern of the first command/address signal CA1. Also, when the delay of the chip selection signal CS is proximate to −0.5 tCK (for example, (d) of FIG. 16B) or to +0.5 tCK (for example, (e) of FIG. 16C), the second command/address signal CA2 may have a partially (that is, only some bits) inverted pattern of the pattern of the first command/address signal CA1.

As described above with reference to FIGS. 17A and 17B, a pass window of about 1 tCK may be measured by measuring a section in which the second command/address signal CA2 has the same pattern as the first command/address signal CA1 or a inverted pattern of the pattern of the first command/address signal CA1, with respect to the chip selection signal CS having an active pulse width of about 1 tCK. Accordingly, the memory controller 200*d* (that is, the timing controller 280*d* of the memory controller 200*d*) may determine a timing of the active pulse of the chip selection signal CS corresponding to a middle (that is, (a) of FIG. 17A or (b) of FIG. 17B) of the pass window as a timing of the chip selection signal CS.

Unlike what is illustrated in FIGS. 17A and 17B, when the active pulse width of the chip selection signal CS is less than 1 tCK, the active pulse of the chip selection signal CS may be latched by one of the first internal clock signal CK_INT1 and the second internal clock signal CK_INT2. Thus, the second command/address signal CA2 may not have the pattern which is the partially inverted pattern of the pattern of the first command/address signal CA1, and may have a pattern the same as the pattern of the first command/address signal CA1 or a inverted pattern of the pattern of the first command/address signal CA1. In this case, the pass window may be a section in which the second command/address signal CA2 has the same pattern as the first command/address signal CA1 or a section in which the second command/address signal CA2 has the inverted pattern of the pattern of the first command/address signal CA1.

Figure 18:
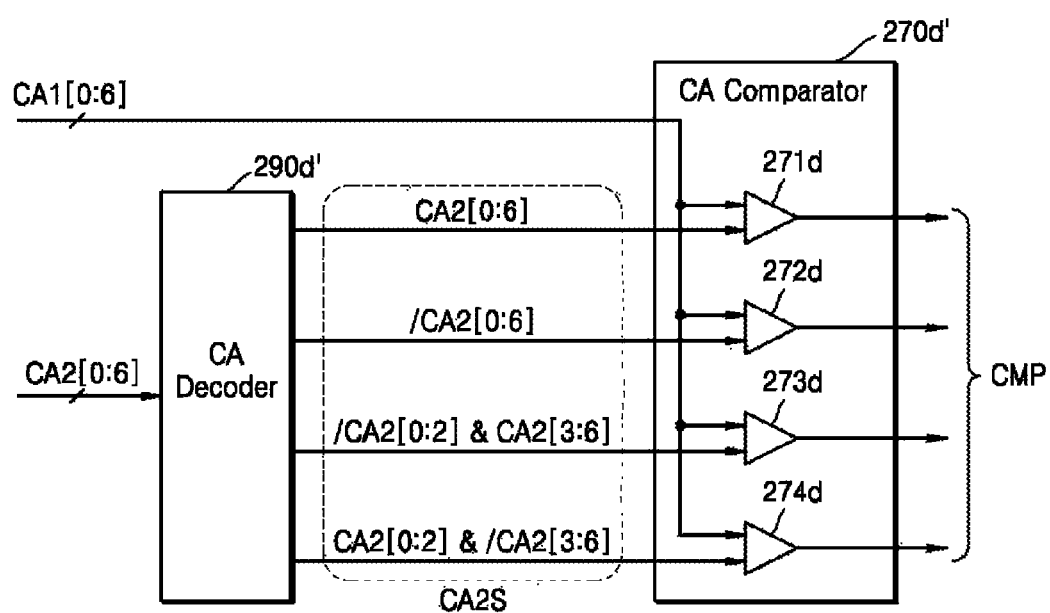
FIG. 18 is a block diagram of examples of a command/address decoder and a command/address comparator of FIG. 14, according to exemplary embodiments.

FIG. 18 is a block diagram of examples 290*d'* and 270*d'* of the command/address decoder 290*d* and the command/address comparator 270*d* of FIG. 14, according to exemplary embodiments. In detail, the command/address decoder 290*d'* and the command/address comparator 270*d'* of FIG. 18 may correspond to the command/address encoder 123*d'* operating as shown in FIGS. 16A, 16B, 16C, 17A, and 17B.

Referring to FIG. 18, the command/address decoder 290*d'* may generate four decoded second command/address signals CA2S by decoding the second command/address signal CA2. Each of the four decoded second command/address signals CA2S may correspond to the second command/address signal CA2 which is possible to be generated by the command/address encoder 123*d* by encoding the first command/address signal CA1 as described above with reference to FIGS. 16A, 16B, and 16C. That is, the command/address decoder 290*d'* may provide the four decoded second command/address signals generated according to four decoding methods, respectively, the four decoding methods corresponding to four encoding methods of the command/address encoder 123*d*.

The command/address comparator 270*d'* may compare each of the four decoded second command/address signals CA2S with the first command/address signal CA1. As illustrated in FIG. 18, the command/address comparator 270*d'* may include four comparators 271*d* through 274*d*, and output signals of the four comparators 271*d* through 274*d* may be included in a comparison signal CMP. Based on the comparison signal CMP, the timing controller 280*d* of FIG. 14 may determine a timing of the active pulse of the chip selection signal CS corresponding to a middle of a section in which the second command/address signal CA2 is the same as the first command/address signal CA1 or as a inverted first command/address signal CA1, as a timing of the chip selection signal CS.

The command/address comparator 270*d'* illustrated in FIG. 18 is only an example, and according to exemplary embodiments, the command/address comparator 270*d* of FIG. 14 may have a different structure from the structure illustrated in FIG. 18. For example, the command/address comparator 270*d* may have a structure in which each of a plurality of decoded second command/address signals CA2S is sequentially compared with the first command/address signal CA1.

Figure 19:
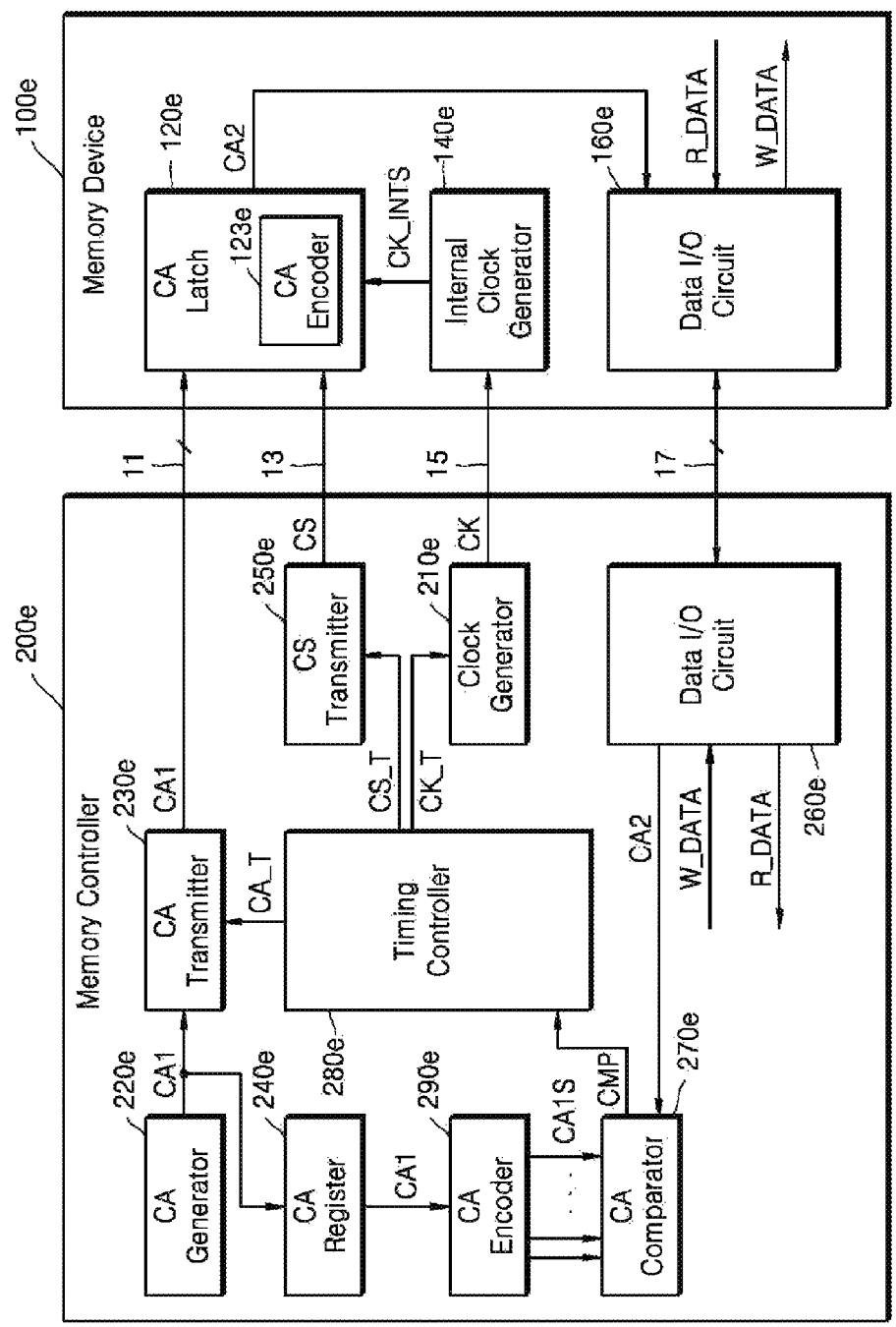
FIG. 19 is a block diagram of a system including a memory device and a memory controller according to exemplary embodiments.

FIG. 19 is a block diagram of a system 1000*e* including a memory device 100*e* and a memory controller 200*e* according to exemplary embodiments. When compared with the system 1000*d* of FIG. 14, in the system 1000*e* of FIG. 19, the memory controller 200*e* may include a command/address encoder 290*e* rather than a command/address decoder. Hereinafter, aspects that are the same or substantially the same as the aspects of the system 1000d of FIG. 14 will not be described.

Referring to FIG. 19, the command/address encoder 290e of the memory controller 200e may receive a first command/address signal CA1 and encode the first command/address signal CA1 to generate a plurality of encoded first command/address signals CA1S. Each of the plurality of encoded first command/address signals CA1S may correspond to a second command/address signal CA2 which is generated by the command/address encoder 123e of the memory device 100e by encoding the first command/address signal CA1. For example, the command/address encoder 290e of the memory controller 200e may provide four sets of the encoded first command/address signals CA1S generated respectively according to the four encoding methods of the command/address encoder 123e of the memory device 100e, which are illustrated in FIGS. 16A, 16B, and 16C.

The command/address comparator 270e may compare each of the plurality of encoded first command/address signals CA1S with the second command/address signal CA2 received from the memory device 100e, and may output a comparison signal CMP according to a result of the comparison. That is, in order to compare the first command/address signal CA1 with the second command/address signal CA2 which is an encoded first command/address signal CA1, the command/address comparator 270e of FIG. 19 may compare signals generated by encoding the first command/address signal CA1 with the second command/address signal CA2, unlike the examples illustrated in FIGS. 14 and 18 in which signals generated by decoding the second command/address signal CA2 are compared with the first command/address signal CA1.

Figure 20:
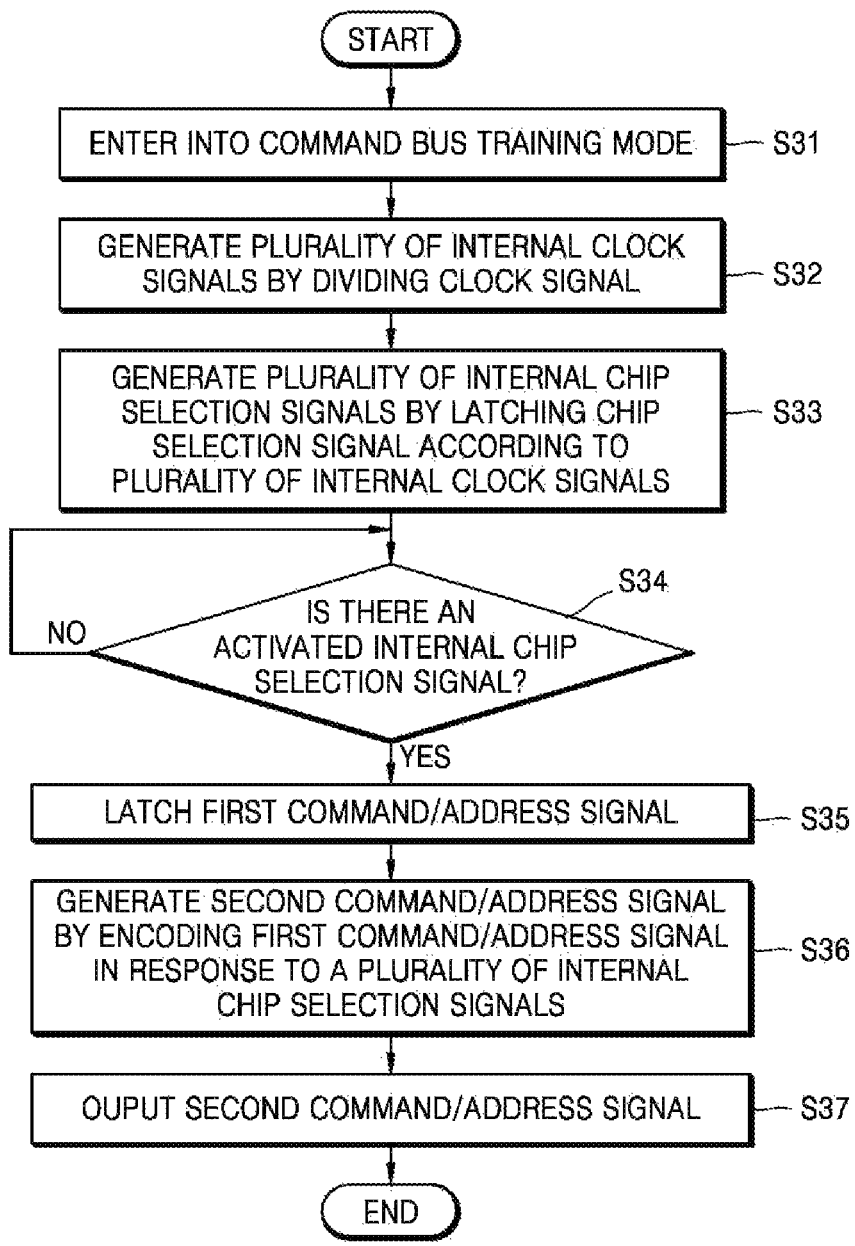
FIG. 20 is a flowchart of an operating method of the memory device of FIG. 14, according to exemplary embodiments.

FIG. 20 is a flowchart of an operating method of the memory device 100d of FIG. 14, according to exemplary embodiments. As illustrated in FIG. 20, the operating method of the memory device 100d may include operations S31 through S37.

In operation S31, an operation of entering into a command bus training mode may be performed. Next, in operation S32, an operation of generating a plurality of internal clock signals CK_INTS by dividing a clock signal CK may be performed. For example, the plurality of internal clock signals CK_INTS may have different phases.

In operation S33, an operation of generating a plurality of internal chip selection signals by latching a chip selection signal CS according to the plurality of internal clock signals CK_INTS may be performed. As described above with reference to FIGS. 16A, 16B, and 16C combinations of levels of the plurality of internal chip selection signals may be finite.

In operation S34, an operation of determining whether there is an activated internal chip selection signal may be performed. That is, an operation of determining whether an active pulse of the chip selection signal CS is latched by the plurality of internal clock signals CK_INTS may be performed. When there is the activated internal chip selection signal, an operation of latching a first command/address signal CA1 may be performed in operation S35.

In operation S36, an operation of generating a second command/address signal CA2 by encoding the first command/address signal CA1 in response to the plurality of internal chip selection signals may be performed. For example, the command/address encoder 123d may differently encode the first command/address signal CA1 according to combinations of levels of the plurality of internal chip selection signals. Thereafter, in operation S37, an operation of outputting the second command/address signal CA2 may be performed.

Figure 21:
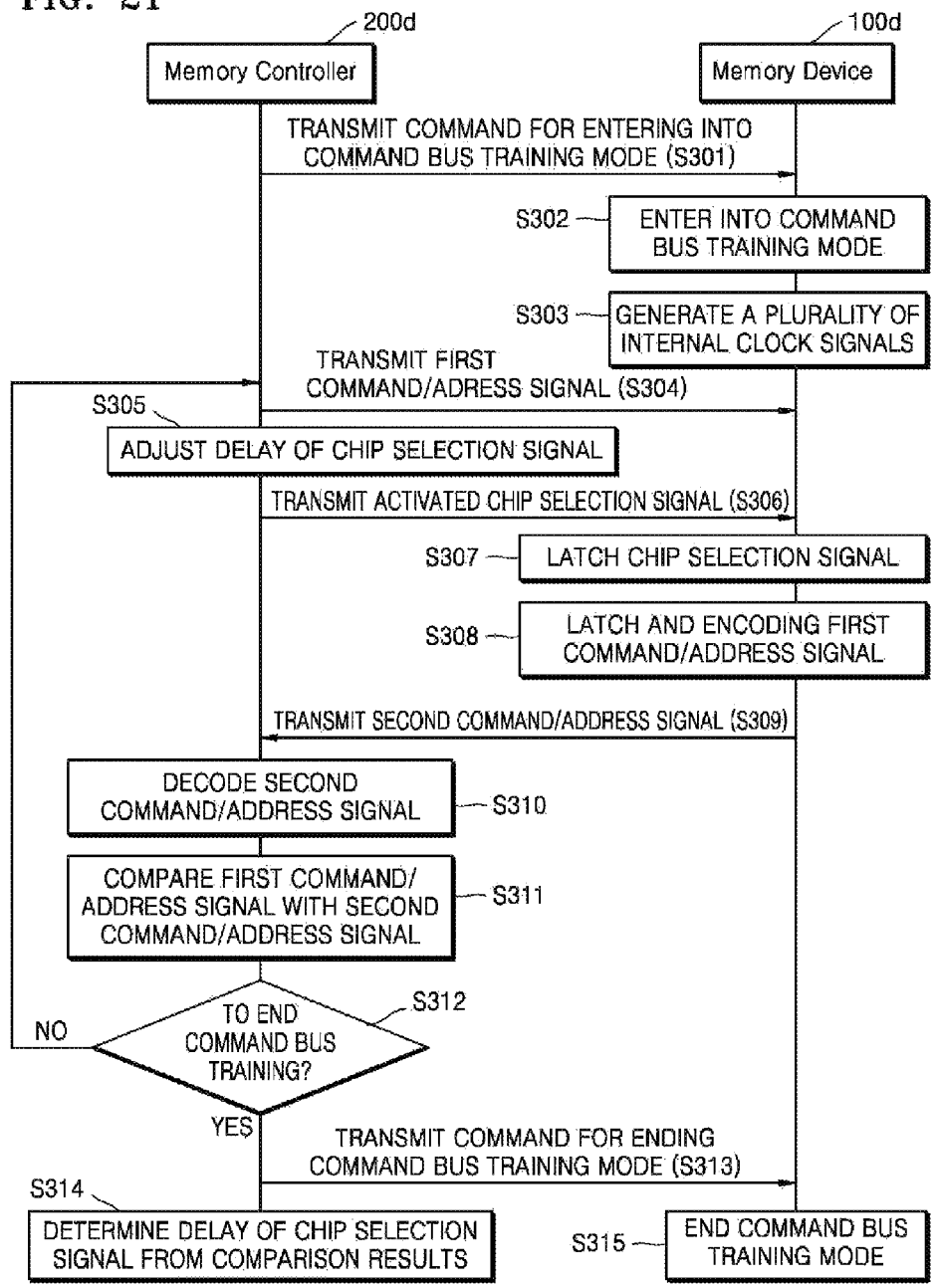
FIG. 21 is a diagram for describing an operation between the memory device and the memory controller of FIG. 14 according to the passage of time, according to exemplary embodiments.

FIG. 21 is a diagram for describing an operation between the memory device 100d and the memory controller 200d of FIG. 14 according to the passage of time, according to exemplary embodiments.

Referring to FIG. 21, the memory controller 200d may transmit a command of entering into a command bus training mode in operation S301. The memory device 100d may enter into the command bus training mode in response to the received command in operation S302. The memory device 100d may generate a plurality of internal clock signals CK_INTS by dividing a clock signal CK in operation S303.

The memory controller 200d may transmit a first command/address signal CA1 in operation S304. Thereafter, the memory controller 200d may adjust a delay of a chip selection signal CS in operation S305, and transmit the chip selection signal CS activated according to the adjusted delay in operation S306.

The memory device 100d may latch the chip selection signal CS in operation S307. For example, the memory device 100d may generate a plurality of internal chip selection signals by latching the chip selection signal CS by using the plurality of internal clock signals CK_INTS. The memory device 100d may latch and encode the first command/address signal CA1 in operation S308. For example, the memory device 100d may generate the second command/address signal CA2 by differently encoding the first command/address signal CA1 according to combinations of levels of the plurality of internal chip selection signals. Thereafter, the memory device 100d may transmit the second command/address signal CA2.

The memory controller 200d may decode the second command/address signal CA2 in operation S310, compare the decoded plurality of second command/address signals CA2S with the first command/address signal CA1 in operation S311, and accumulate results of the comparison. Also, like the memory controller 200e illustrated in FIG. 19, the plurality of encoded first command/address signals CA1S may be generated by encoding the first command/address signal CA1, and the plurality of first command/address signals CA1S and the second command/address signal CA2 may be compared with each other.

The memory controller 200d may determine whether to end command bus training S312, and when the command bus training is to be ended, the memory controller 200d may transmit a command of ending the command bus training mode to the memory device 100d in operation S313. The memory controller 200d may determine a delay of the chip selection signal CS from the comparison results in operation S314, and the memory device 200d may end the command/address mode in response to the command of ending the command bus training mode in operation S315.

Figure 22:
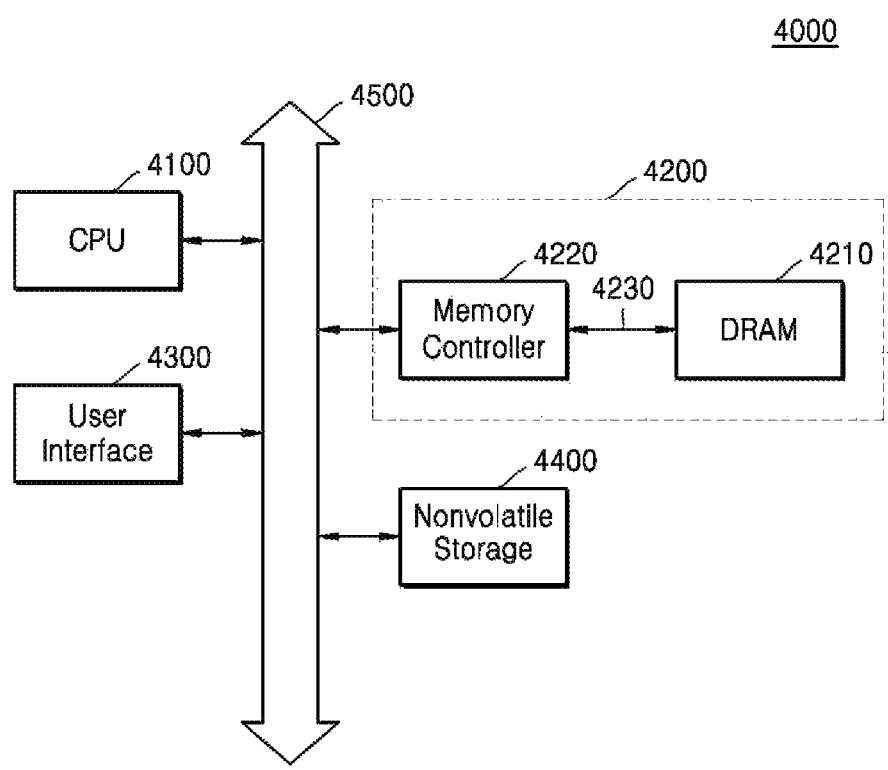
FIG. 22 is a block diagram of a computing system according to a certain embodiment.

FIG. 22 is a block diagram of a computing system 4000 according to exemplary embodiments. As illustrated in FIG. 22, the computing system 4000 may include a central processing device 4100, a memory system 4200, a user interface 4300, and a non-volatile storage device 3400. The central processing device 4100, the memory system 4200, the user interface 4300, and the non-volatile storage 4400 may communicate with one another through a bus 4500. Although it is not illustrated in FIG. 22, the computing system 4000 may further include ports that may communicate with a video card, a sound card, a memory card, a universal serial bus (USB) device, or other electronic devices. The computing system 4000 may be realized as a personal computer, or portable electronic devices, such as laptop computers, cellular phones, personal digital assistants (PDAs), and cameras.

The central processing device 4100 may perform specific calculations or tasks. According to an exemplary embodiment, the central processing device 4100 may be a microprocessor, a graphics processing unit (GPU), etc. The central processing device 4100 may communicate with the memory system 4200, the user interface 4300, and the non-volatile storage 4400 through the bus 4500. The central processing device 4100 may be connected to an expansion bus, such as a peripheral component interconnect (PCI) bus.

The memory system 4200 may include a DRAM 4210 and a memory controller 4220, and may store data necessary for an operation of the computing system 4000. For example, the memory system 4200 may function as a data memory of the central processing device 4100, and may support direct memory access (DMA) to store data received from the bus 4500 or transmit the stored data to the bus 4500. The memory devices according to the exemplary embodiments may be included in the memory system 4200 as the DRAM 4210, and the memory controller 4220 may be included in the memory system 4200. The DRAM 4210 and the memory controller 4220 may operate according to the exemplary embodiments. For example, the internal clock signal CK_INT may be generated by dividing the clock signal CK received from the memory controller 4220, and the internal clock signal CK_INT may be used to capture the chip selection signal CS and the first command/address signal CA1.

The user interface 4300 may include input devices, such as a keyboard, a keypad, a mouse, etc. to receive an input signal from a user, and may include output devices, such as a printer, a display device, etc. to provide an output signal to the user.

The non-volatile storage 4400 may include non-volatile semiconductor memory devices, such as EEPROM, flash memory, PRAM, RRAM, NFGM, PoRAM, MRAM, FRAM, etc., and may also include a magnetic disk.

While the present disclosure has been particularly shown and described with reference to embodiments thereof, it will be understood that various changes in form and details may be made therein without departing from the spirit and scope of the following claims.

What is claimed is:

1. An operating method of a memory device supporting command bus training, the operating method comprising:
    entering into a mode of the command bus training;
    receiving a clock signal, chip selection signal and a first command/address signal;
    generating a plurality of internal clock signals by dividing the clock signal;
    generating a plurality of internal chip selection signals by latching the chip selection signal according to the plurality of internal clock signals;
    generating a second command/address signal by encoding the first command/address signal based on the plurality of internal chip selection signals; and
    outputting the second command/address signal.

2. The operating method of claim 1, wherein generating the second command/address signal comprises generating the second command/address signal by differently encoding the first command/address signal according to voltage levels of the plurality of internal chip selection signals.

3. The operating method of claim 2, wherein the plurality of internal clock signals comprise first and second internal clock signals each having the same frequency and a phase difference of 180 degrees with respect to each other, and
    wherein the plurality of internal chip selection signals comprise first and second internal chip selection signals generated by latching the chip selection signal according to the first and second internal clock signals, respectively.

4. The operating method of claim 3, wherein generating the second command/address signal comprises:
    encoding the first command/address signal by a first encoding method when only the first internal chip selection signal is activated,
    encoding the first command/address signal by a second encoding method when only the second internal chip selection signal is activated,
    encoding the first command/address signal by a third encoding method when the first and second internal chip selection signals are activated in this stated order, and
    encoding the first command/address signal by a fourth encoding method when the second and first internal chip selection signals are activated in this stated order.

5. The operating method of claim 2, wherein generating the second command/address signal comprises generating the second command/address signal by inverting or non-inverting at least one bit of the first command/address signal according to the voltage levels of the plurality of internal chip selection signals.

6. A command bus training method in a system in which a command/address signal and a clock signal are provided to a memory device from a memory controller, the command bus training method comprising:
    generating a plurality of internal clock signals in the memory device by dividing the clock signal;
    transmitting a first command/address signal by the memory controller;
    transmitting a chip selection signal by the memory controller, the chip selection signal having an adjustable delay with respect to each of the internal clock signals;
    generating a plurality of internal chip selection signals in the memory device by latching the chip selection signal according to the plurality of internal clock signals;
    generating and transmitting by the memory device, a second command/address signal by encoding the first command/address signal based on the plurality of internal chip selection signals; and
    determining a delay of the chip selection signal based on the first and second command/address signals in the memory controller.

7. The command bus training method of claim 6, wherein determining the delay of the chip selection signal comprises:
    generating a plurality of decoded signals by decoding the second command/address signal;
    comparing each of the plurality of decoded signals to the first command/address signal; and
    determining the delay of the chip selection signal based on a plurality of comparison results corresponding to the adjustable delay of the chip selection signal.

8. The command bus training method of claim 7, wherein generating the plurality of decoded signals comprises generating the plurality of decoded signals by inverting or non-inverting at least one bit of the second command/address signal.

9. The command bus training method of claim 6, wherein determining the delay of the chip selection signal comprises:
    generating a plurality of second encoded signals by encoding the first command/address signal;

comparing each of the plurality of second encoded signals to the second command/address signal; and determining the delay of the chip selection signal based on a plurality of comparison results corresponding to the adjustable delay of the chip selection signal.

10. The command bus training method of claim 9, wherein generating the plurality of second encoded signals comprises generating the plurality of second encoded signals by inverting or non-inverting at least one bit of the first command/address signal.

11. The command bus training method of claim 6, wherein generating and transmitting the second command/address signal comprises generating the second command/address signal by differently encoding the first command/address signal according to levels of the plurality of internal chip selection signals.

12. The command bus training method of claim 11, wherein generating the second command/address signal comprises generating the second command/address signal by inverting or non-inverting at least one bit of the first command/address signal according to the levels of the plurality of internal chip selection signals.

13. The command bus training method of claim 11, wherein the plurality of internal clock signals comprise first and second internal clock signals each having the same frequency and a phase difference of 180 degrees with respect to each other, and wherein the plurality of internal chip selection signals comprise first and second internal chip selection signals generated by latching the chip selection signal according to the first and second internal clock signals, respectively.

14. The command bus training method of claim 13, wherein generating and transmitting the second command/address signal comprises:

encoding the first command/address signal by a first encoding method when only the first internal chip selection signal is activated, encoding the first command/address signal by a second encoding method when only the second internal chip selection signal is activated, encoding the first command/address signal by a third encoding method when the first and second internal chip selection signals are activated in this stated order, and encoding the first command/address signal by a fourth encoding method when the second and first internal chip selection signals are activated in this stated order.

15. The command bus training method of claim 14, wherein determining the delay of the chip selection signal comprises determining a median value of delays of the chip selection signal corresponding to the second command/address signal encoded by the first encoding method, or a median value of the chip selection signal corresponding to the second command/address signal encoded by the second encoding method, as the delay of the chip selection signal.

16. A method of command bus training for a semiconductor device, the method comprising:

receiving a first command/address signal, and a clock signal having a first frequency;

generating internal clock signals based on the clock signal, each of the internal clock signals having a second frequency and different phases with respect to each other, wherein the second frequency is smaller than the first frequency;

a) receiving a chip selection signal having variable delays with respect to each of the internal clock signals;

b) generating internal chip selection signals by latching the chip selection signal based on the internal clock signals;

c) generating a second command/address signal by encoding the first command/address signal based on the internal chip selection signals; and determining a delay of the chip selection signal based on the first and second command/address signals.

17. The method of claim 16, wherein determining the delay of the chip selection signal comprises:

d) generating decoded signals by decoding the second command/address signal;

e) comparing the first command/address signal to the decoded signals;

repeating a), b), c), d), and e) with a different delay of the variable delays of the chip selection signal; and determining the delay of the chip selection signal based on the comparison results.

18. The method of claim 16, wherein determining the delay of the chip selection signal comprises:

d) generating second encoded signals by encoding the first command/address signal;

e) comparing the second command/address signal to the second encoded signals;

repeating a), b), c), d), and e) with a different delay of the variable delays of the chip selection signal; and determining the delay of the chip selection signal based on the comparison results.

19. The method of claim 16, wherein the internal clock signals comprise first and second internal clock signals, wherein the internal chip selection signals comprise first and second internal chip selection signals generated by latching the chip selection signal based on the first and second internal clock signals, respectively, wherein the second command/address signal includes a first set of command/address signals and a second set of command/address signals, wherein, when only one of the first and second internal chip selection signals is activated the first and second sets of command/address signals are either non-inverted or inverted, and wherein, when both of the first and second internal chip selection signals are activated at a different time only one set of the first and second sets of command/address signals is either non-inverted or inverted.

20. The method of claim 19, wherein when both of the first and second internal chip selection signals are activated at a different time the first set of command/address signals is generated based on a first activated signal of the first and second internal chip selection signals, and the second set of command/address signals is generated based on a second activated signal of the first and second internal chip selection signals.

* * * * *